US 7,604,708 B2

(12) United States Patent
Wood et al.

(10) Patent No.: US 7,604,708 B2
(45) Date of Patent: Oct. 20, 2009

(54) CLEANING OF NATIVE OXIDE WITH HYDROGEN-CONTAINING RADICALS

(75) Inventors: Bingxi Sun Wood, Stanford, CA (US); Mark N. Kawaguchi, Palo Alto, CA (US); James S. Papanu, San Rafael, CA (US); Roderick C. Mosely, Pleasanton, CA (US); Chiukun Steven Lai, Sunnyvale, CA (US); Chien-Teh Kao, Sunnyvale, CA (US); Hua Ai, Mountain View, CA (US); Wei W. Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 616 days.

(21) Appl. No.: 10/778,898

(22) Filed: Feb. 12, 2004

(65) Prior Publication Data

US 2004/0219789 A1 Nov. 4, 2004

Related U.S. Application Data

(60) Provisional application No. 60/447,372, filed on Feb. 14, 2003.

(51) Int. Cl.
*C23C 16/00* (2006.01)
*C23F 1/00* (2006.01)
*H01L 21/306* (2006.01)

(52) U.S. Cl. ............................ 156/345.35; 156/345.33; 118/715; 118/723 ME; 118/723 ER; 118/723 IR

(58) Field of Classification Search .......... 118/723 ME, 118/723 ER, 723 IR; 156/345.35
See application file for complete search history.

(56) References Cited

U.S. PATENT DOCUMENTS

| 4,138,306 A | 2/1979 | Niwa |
| 4,563,367 A | 1/1986 | Sherman |

(Continued)

FOREIGN PATENT DOCUMENTS

| DE | 41 32 559 A1 | 4/1993 |

(Continued)

OTHER PUBLICATIONS

Mikagi et al., "Barrier Metal Free Copper Damascene Interconnection Technology Using Atmospheric Copper Reflow and Nitrogen Doping in SiOF Film", 1996 IEEE, IEVM 96, 365-368, pp. 14.5.1-14.5.4.

(Continued)

*Primary Examiner*—Parviz Hassanzadeh
*Assistant Examiner*—Rakesh K Dhingra
(74) *Attorney, Agent, or Firm*—Janah & Associates, P.C.

(57) ABSTRACT

A substrate cleaning apparatus has a remote source to remotely energize a hydrogen-containing gas to form an energized gas having a first ratio of ionic hydrogen-containing species to radical hydrogen-containing species. The apparatus has a process chamber with a substrate support, an ion filter to filter the remotely energized gas to form a filtered energized gas having a second ratio of ionic hydrogen-containing species to radical hydrogen-containing species, the second ratio being different than the first ratio, and a gas distributor to introduce the filtered energized gas into the chamber.

16 Claims, 12 Drawing Sheets

U.S. PATENT DOCUMENTS

| | | | |
|---|---|---|---|
| 4,910,042 A | 3/1990 | Hokynar | |
| 4,913,929 A | 4/1990 | Moslehi et al. | |
| 4,987,284 A | 1/1991 | Fujimura et al. | |
| 4,988,644 A | 1/1991 | Jucha et al. | |
| 5,000,113 A | 3/1991 | Wang et al. | |
| 5,079,481 A * | 1/1992 | Moslehi | 315/111.41 |
| 5,158,644 A | 10/1992 | Cheung et al. | |
| 5,198,718 A | 3/1993 | Davis et al. | |
| 5,232,872 A | 8/1993 | Ohba | |
| 5,284,544 A | 2/1994 | Mizutani et al. | |
| 5,336,366 A * | 8/1994 | Cain et al. | 438/730 |
| 5,346,579 A | 9/1994 | Cook et al. | |
| 5,350,480 A | 9/1994 | Gray | |
| 5,384,465 A | 1/1995 | Armour et al. | |
| 5,385,624 A | 1/1995 | Amemiya et al. | |
| 5,403,434 A | 4/1995 | Moslehi | |
| 5,409,543 A | 4/1995 | Panitz et al. | |
| 5,451,263 A | 9/1995 | Linn et al. | |
| 5,518,572 A | 5/1996 | Kinoshita et al. | |
| 5,565,681 A | 10/1996 | Loewenhardt et al. | |
| 5,637,180 A | 6/1997 | Gosain et al. | |
| 5,662,770 A | 9/1997 | Donohoe | |
| 5,688,357 A | 11/1997 | Hanawa | |
| 5,726,097 A | 3/1998 | Yanagida | |
| 5,736,002 A | 4/1998 | Allen et al. | |
| 5,770,098 A | 6/1998 | Araki et al. | |
| 5,792,272 A | 8/1998 | van Os et al. | |
| 5,801,098 A | 9/1998 | Fiordalice et al. | |
| 5,812,403 A | 9/1998 | Fong et al. | |
| 5,834,371 A | 11/1998 | Ameen et al. | |
| 5,844,195 A | 12/1998 | Fairbairn et al. | |
| 5,899,720 A | 5/1999 | Mikagi | |
| 5,904,571 A * | 5/1999 | Patrick et al. | 438/731 |
| 5,942,804 A | 8/1999 | Mohwinkel et al. | |
| 5,950,083 A | 9/1999 | Inoue et al. | |
| 5,970,378 A | 10/1999 | Shue et al. | |
| 6,007,671 A | 12/1999 | Fujimura et al. | |
| 6,039,834 A | 3/2000 | Tanaka et al. | |
| 6,060,400 A | 5/2000 | Oehrlein et al. | |
| 6,083,363 A | 7/2000 | Ashtiani et al. | |
| 6,107,192 A | 8/2000 | Subrahmanyan et al. | |
| 6,125,859 A | 10/2000 | Kao et al. | |
| 6,130,436 A | 10/2000 | Renau et al. | |
| 6,148,832 A | 11/2000 | Gilmer et al. | |
| 6,169,027 B1 | 1/2001 | Dobson et al. | |
| 6,170,428 B1 | 1/2001 | Redeker et al. | |
| 6,174,823 B1 | 1/2001 | Dobson | |
| 6,182,602 B1 | 2/2001 | Redeker et al. | |
| 6,183,614 B1 | 2/2001 | Fu | |
| 6,217,951 B1 | 4/2001 | Mizuno et al. | |
| 6,251,775 B1 | 6/2001 | Armbrust et al. | |
| 6,274,008 B1 | 8/2001 | Gopalraja et al. | |
| 6,326,794 B1 * | 12/2001 | Lundquist et al. | 324/678 |
| 6,346,489 B1 | 2/2002 | Cohen et al. | |
| 6,355,571 B1 | 3/2002 | Huang et al. | |
| 6,388,383 B1 * | 5/2002 | Ni et al. | 315/111.81 |
| 6,444,040 B1 * | 9/2002 | Herchen et al. | 118/715 |
| 6,468,386 B1 * | 10/2002 | Jeffryes | 156/345.34 |
| 6,504,159 B1 | 1/2003 | Keller | |
| 6,511,575 B1 | 1/2003 | Kitagawa et al. | |
| 6,555,832 B1 | 4/2003 | Ryding et al. | |
| 6,635,578 B1 | 10/2003 | Xu et al. | |
| 6,639,227 B1 | 10/2003 | Glavish et al. | |
| 6,710,358 B1 | 3/2004 | Chen et al. | |
| 6,758,949 B2 | 7/2004 | Wang et al. | |
| 6,960,502 B2 | 11/2005 | Yamaguchi | |
| 7,235,795 B2 | 6/2007 | Simmons | |
| 2002/0124867 A1 | 9/2002 | Kim et al. | |
| 2002/0144706 A1 * | 10/2002 | Davis et al. | 134/1.1 |
| 2003/0232491 A1 | 12/2003 | Yamaguchi | |
| 2004/0045811 A1 | 3/2004 | Wang et al. | |
| 2004/0219789 A1 | 11/2004 | Wood et al. | |
| 2004/0256573 A1 | 12/2004 | Mollica | |
| 2006/0000805 A1 | 1/2006 | Todorow et al. | |
| 2006/0042752 A1 | 3/2006 | Rueger | |
| 2007/0117397 A1 | 5/2007 | Fu et al. | |
| 2007/0190266 A1 | 8/2007 | Fu et al. | |
| 2009/0017227 A1 | 1/2009 | Fu et al. | |

FOREIGN PATENT DOCUMENTS

| | | |
|---|---|---|
| EP | 0367 568 A1 | 5/1990 |
| EP | 0443154 | 8/1991 |
| EP | 0522296 | 1/1993 |
| EP | 0 552 491 A1 | 7/1993 |
| EP | 0 680 070 A1 | 11/1995 |
| EP | 0 684 671 A1 | 11/1995 |
| EP | 0 697 467 A1 | 2/1996 |
| EP | 0704552 | 4/1996 |
| EP | 0 537 950 B1 | 4/1997 |
| EP | 0 780 485 B1 | 6/1997 |
| EP | 0 849 779 A3 | 6/1998 |
| EP | 1081 750 A2 | 2/2003 |
| EP | 1081 750 A3 | 2/2003 |
| JP | 62 158 859 A | 7/1987 |
| JP | 1220434 | 9/1989 |
| JP | 01-290224 | 11/1989 |
| JP | 2125876 | 5/1990 |
| JP | 04 072 724 | 3/1992 |
| JP | 04 273 442 | 9/1992 |
| JP | 05-215064 | 8/1993 |
| JP | 06-084835 | 3/1994 |
| JP | 06 204 191 | 7/1994 |
| JP | 09 082 689 | 3/1997 |
| JP | 09-082689 | 3/1997 |
| JP | 10-022279 | 1/1998 |
| JP | 11 016 912 | 1/1999 |
| JP | 2001-500322 | 1/2001 |
| JP | 2001-203194 | 7/2001 |
| WO | WO 90/10945 | 9/1990 |
| WO | WO 97/03223 | 1/1997 |
| WO | WO 99/01888 | 1/1999 |
| WO | WO 99/02754 | 1/1999 |
| WO | WO 99/03312 | 1/1999 |
| WO | WO-99/06610 A | 2/1999 |
| WO | WO-01/27968 A1 | 4/2001 |
| WO | WO-2004/074932 A3 | 10/2004 |
| WO | WO-2006/016165 A1 | 2/2006 |
| WO | WO-2007/087067 A2 | 8/2007 |
| WO | WO-2007/094961 A2 | 8/2007 |

OTHER PUBLICATIONS

Research Disclosure XP000099373, "Low Temperature Process for Surface Cleaning", No. 309, p. 82, Jan. 1, 1990.

S. Hymes et al., "Surface Cleaning of Copper by Thermal and Plasma Treatment in Reducing and Inert Ambients", 1 Vac. Sci. Technol. vol. 16, No. 3 May/Jun. 1998, pp. 1107-1109.

Sawada et al., "The reduction of copper oxide thin films with hydrogen plasma generated by an atmospheric-pressure glow discharge", J. Phys. D, Appl. Phys. 29 (1996), pp. 2539-2544.

Mandal et al., "Comparison of K<3 Silicon Oxide-Based Dielectric Pre-Copper Material Metalization Preclean Processes Using Black Diamond", 1999 IEEE/SEMI Advanced Semiconductor Manufacturing Conference, pp. 299-303.

Ueno et al., "Cleaning of CHF plasma-etched SiO2/SiN/Cu via structures using a hydrogen plasma, an oxygen plasma, and hexafluoroacetylacetone vapors", 1998 American Vacuum Society, pp. 2986-2995.

Grill, Cold Plasma in Materials Fabrication, IEEE Press, 1994, pp. 109-110, 160-163, New York.

* cited by examiner

CLEANING OF NATIVE OXIDE WITH HYDROGEN-CONTAINING RADICALS

CROSS-REFERENCE

This application claims priority from U.S. Provisional Patent Application Ser. No. 60/447,372, filed on Feb. 14, 2003, to Wood et al., commonly assigned to Applied Materials, Inc., which is herein incorporated by reference in its entirety.

BACKGROUND

In the processing of substrates, such as semiconductors or display, materials are deposited on the substrate and etched to form electrically conducting interconnects, contacts, and vias. For example, a pattern of electrical interconnect lines can be formed by depositing a metal-containing conductor on the substrate, forming a resist pattern on the conductor, etching the conductor to form the interconnect lines, and then depositing a dielectric layer over the etched interconnect lines. The dielectric layer can be further etched to form contact holes or vias that expose the underlying metal-containing conductor material or other substrate regions, respectively. Electrically conducting material is then deposited into the etched holes to electrically contact the underlying conductor. For example, in the formation of copper-containing interconnects, the dielectric layer can be etched to form contact holes that expose an underlying copper conductor material. A thin seed layer of copper may then be deposited over the exposed copper conductor material and surfaces of the contact hole to facilitate a subsequent copper electroplating process that at least partially fills the contact hole.

However, the metal-containing conductor material can comprise deposits of material that require cleaning before subsequent process steps can be performed. For example, the deposits can comprise a native oxide film that forms when the conductor is exposed to oxygen species during an intermediate process step. A native oxide film often forms in a resist stripping process in which an oxygen-containing gas plasma is used to strip residual resist. The native oxide can also form when transferring the substrate between different process chambers, such as between etching, stripping and cleaning process steps. The native oxide films are undesirable because they increase the electrical resistance at the contact interface between the exposed conductor surface and the subsequently deposited electrically conducting material. The deposits can also comprise other process deposits remaining from previous process steps, such as for example carbon-containing, silicon-containing, fluorine-containing and nitrogen-containing residues. The deposits are also undesirable because they can adversely affect the deposition of the electrically conducting materials onto the exposed conductor surface, for example by forming voids or other irregularities at the interface between the exposed and deposited materials.

The native oxide film can be removed from the metal-containing conductor in a "pre-cleaning" process performed before deposition of the electrically conducting material on the exposed conductor surface. In a typical pre-cleaning process, the exposed surface of the metal-containing conductor is cleaned by an argon plasma that physically bombards the substrate with energized argon ions to sputter off the film. However, it is difficult to determine the correct energy level to be applied to the energized ions. Excessive ion energy can sputter the underlying metal while too low an energy level can cause the film to remain on the substrate. The film can also be cleaned using an energized reducing gas, such as for example hydrogen, which is chemically reacted with the film to reduce the oxides in the film to volatile hydroxyls and water vapor, as described for example in U.S. Pat. No. 6,346,480 to Cohen et al., which is also incorporated herein by reference in its entirety. However, the reducing agent can also have adverse chemical effects on surrounding materials, for example, the hydrogen species can chemically react with exposed metals to form metal hydrides, which again would undesirably affect the electrical conductivity of the exposed portions.

Conventional cleaning processes are particularly unsuitable to clean metal-containing surfaces surrounded by low-k (low dielectric constant) material, such as for example, Black Diamond™, a low-k silicon oxycarbide fabricated by Applied Materials, Inc., Santa Clara, Calif. In such cleaning processes, the cleaning gases react with the low-k material to change their dielectric values. For example, a conventional cleaning process using cleaning gas combinations such as $O_2$, $O_2/N_2$, $O_2/H_2O$, $O_2/N_2/H_2O$, $O_2/CF_4$ and $O_2/CF_4/H_2O$ can increase the k value of a low-k dielectric from a k value of about 2.7 to a k value as high as about 4.0, which is similar to the k value for silicon oxide. Low-k materials are believed to be particularly susceptible to damage in these cleaning processes at least in part because the ions generated in these processes, and especially "light" ions such as hydrogen and helium ions, can penetrate deeply into the low-k material and damage the structure of the film. As low-k dielectrics are being more frequently used in semiconductor devices to improve their performance and speed, it is desirable to have a process that can effectively clean these substrates without adversely affecting the dielectric constant values.

Accordingly, it is desirable to deposit metal-containing material on a clean electrically conducting surface without forming a native oxide or other contaminant deposits on the surface. It is further desirable to be able to clean the conductor without adversely affecting surrounding materials. For example, it is desirable to clean a native oxide film from a metal-containing conductor without changing the k value of a surrounding low-k dielectric material on the substrate.

SUMMARY

A substrate cleaning apparatus has a remote source to energize a hydrogen-containing gas to form a remotely energized gas comprising a first ratio of ionic hydrogen-containing species to radical hydrogen-containing species. The cleaning apparatus also has a process chamber having a substrate support, an ion filter to filter the remotely energized gas to form a filtered energized gas having a second ratio of ionic hydrogen-containing species to radical hydrogen-containing species, the second ratio being different than the first ratio, and a gas distributor to introduce the filtered energized gas into the chamber.

In one version, the substrate cleaning apparatus comprises a quartz gas distribution plate and a quartz chamber liner that serve to filter the remotely energized gas to form the filtered energized gas.

To clean a substrate in the apparatus, a substrate is placed in a process zone of the apparatus. In a remote zone, energy is coupled to a hydrogen-containing gas to form a remotely energized gas having a first ratio of ionic hydrogen-containing species to radical hydrogen-containing species. The remotely energized gas is filtered to form a filtered energized gas having a second ratio of ionic hydrogen-containing species to radical hydrogen-containing species that is different from the first ratio, and the filtered energized gas is introduced into the process zone to clean the substrate.

Another version of the apparatus is capable of both cleaning deposits from the substrate and depositing a metal-containing conductor on a substrate. In this apparatus, the cleaning chamber includes an exhaust system to maintain a pressure of less than about 10 mTorr in the cleaning chamber. The apparatus also has a deposition chamber having a substrate support, a sputtering target facing the substrate support, a gas delivery system to introduce a gas into the sputtering chamber, a gas energizer to energize the gas to sputter material from the target onto the substrate, and an exhaust system to exhaust the gas from the deposition chamber. A transfer chamber has a robot to transfer the substrate from the cleaning chamber to the sputtering chamber. The transfer chamber has an enclosure capable of maintaining the substrate in a low pressure environment of less than about 10 mTorr and an outlet to exhaust gas from the transfer chamber to maintain the low pressure environment. A controller operates the cleaning chamber, sputtering chamber, and robot to clean the deposits from a first metal-containing conductor on the substrate and then transfer the substrate to the sputtering chamber to deposit a second metal-containing conductor on the cleaned first metal-containing conductor.

In one version, a method is provided to clean deposits from a substrate having a dielectric material with features formed therein that expose an underlying metal-containing conductor. The method includes a heat treatment step and a cleaning step. In the heat treatment step, the substrate is exposed to a hydrogen-containing gas while maintaining a temperature of the substrate of at least about 100° C. In the cleaning step, the substrate is exposed to a remotely energized gas, the remotely energized gas having hydrogen-containing radical species, to clean the substrate.

In one version of an apparatus to clean deposits from a substrate and perform a heat treatment process, the apparatus has a heat treatment chamber and a cleaning chamber. The heat treatment chamber has a substrate support, a heater to heat the substrate, a gas delivery system to introduce a hydrogen-containing gas into the chamber, and an exhaust system to exhaust gas from the heat treatment chamber. The cleaning chamber has a substrate support, a remote source to remotely energize a hydrogen-containing gas to form an energized gas comprising a first ratio of ionic hydrogen-containing species to radical hydrogen-containing species, a gas distributor to introduce the remotely energized gas into the chamber, an ion filter to filter the remotely energized gas to form a filtered energized gas having a second ratio of ionic hydrogen-containing species to radical hydrogen-containing species, the second ratio being different than the first ratio, and an exhaust system to exhaust the gas from the cleaning chamber. The apparatus also has a transfer chamber having a robot to transfer the substrate from the heat treatment chamber to the cleaning chamber, the transfer chamber having an enclosure capable of maintaining the substrate in a vacuum environment, and an outlet to exhaust gas from the transfer chamber to maintain the vacuum environment. The apparatus also has a controller to operate the heat treatment chamber, cleaning chamber, and robot to treat the substrate in the heat treatment chamber and transfer the substrate to the cleaning chamber to clean deposits from a metal-containing conductor on the substrate.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of particular drawings, and the invention includes any combination of these features, where:

DESCRIPTION

Figure 1A:
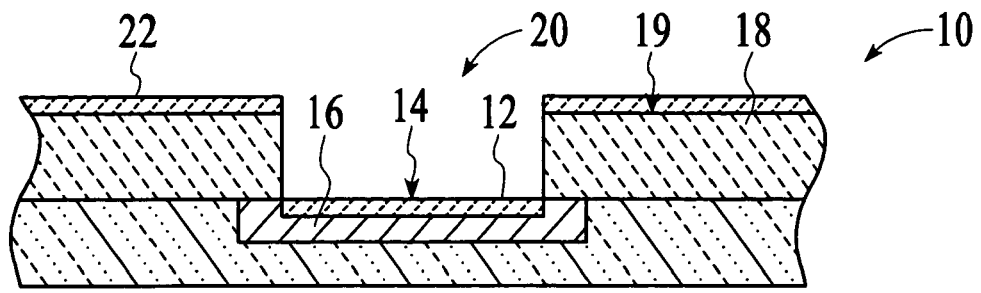
FIGS. 1a through 1d are partial sectional side views of an embodiment of a substrate in various processing stages, the substrate having a metal-containing conductor and a low-k dielectric layer.
Figure 1B:
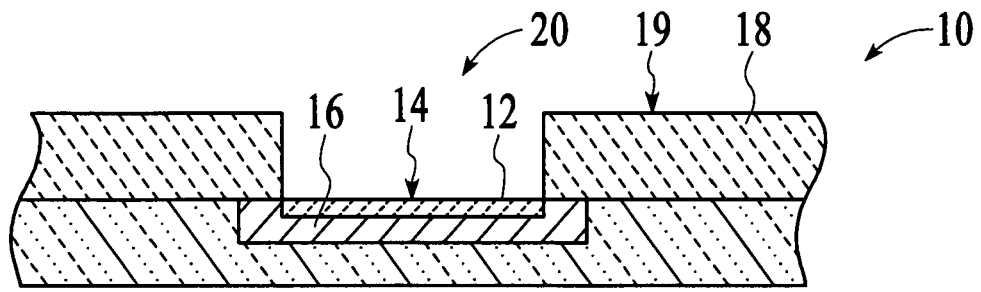
Figure 1C:
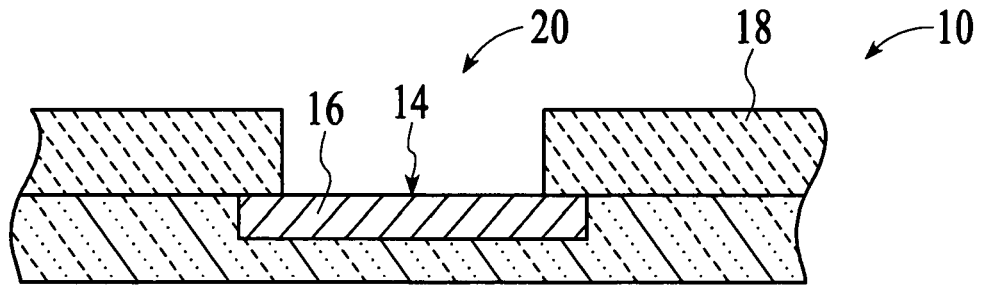
Figure 1D:
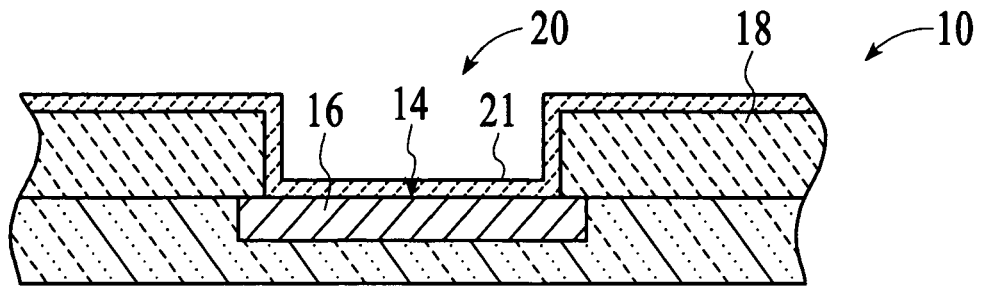

A cleaning process is performed to clean a surface 14 of a metal-containing conductor 16 on a substrate 10. For example, the cleaning process is useful to remove deposits 12 formed on the surface 14, such as a native oxide film 12 formed from exposure of the surface to an oxygen-containing environment. The deposits 12 can also comprise process residues formed in previous process steps, such as for example residues containing carbon, nitrogen, fluorine and silicon, and even polymeric residue. The cleaning process can clean the surface 14 of a metal-containing conductor 16 comprising, for example, copper, aluminum, titanium, tungsten, or alloys or compounds thereof. An embodiment of a substrate 10 comprising a metal-containing conductor 16 is shown in FIGS. 1a-d. The substrate 10 comprises an underlying metal-containing conductor 16 over which a low-k dielectric layer 18 is formed. The low-k dielectric layer 18 comprises a dielectric material having a k value of less than about 3.0, such as from about 2.0 to about 3.0, and even a k value of less than about 2.7. For example, a suitable low-k dielectric layer may comprise Black Diamond™, a low-k silicon oxycarbide fabricated by Applied Materials, Inc., Santa Clara, Calif. Other suitable low-k dielectric layers can comprise combinations of silicon with at least one of oxygen, carbon, hydrogen and other elements. The dielectric layer 18 comprises features 20 therein that expose the surface 14 of the metal-containing conductor 16 having the deposits 12, as shown in FIGS. 1a and 1b. The cleaning process removes the deposits 12 from the surface 14 of the metal-containing conductor 16 to allow good electrical contact between the cleaned surface 14 and subsequent materials deposited on the substrate 10, as shown in FIGS. 1c and 1d.

It has been discovered that an improved cleaning process comprises exposing the substrate 10 to an energized cleaning gas comprising hydrogen-containing radicals. Hydrogen-containing radicals are hydrogen-containing species that have one unpaired electron, and thus are highly chemically reactive, but do not have a positive or negative charge, such as for example hydrogen atoms (H.), hydroxyl radicals (OH.), nitrogen containing radicals ($NH_2$., $NH_3$.), and carbon containing radicals such as methyl radicals ($CH_3$.). It is believed that the hydrogen-containing radicals provide a relatively gentler cleaning process by chemically reacting with the oxygen component of the deposits 12, such as native oxide, to form volatile hydroxyls and water vapor that can be exhausted, thereby removing the deposits 12 from the surface 14 of the metal-containing conductor 16. Thus, the energized hydrogen-containing radicals interact more specifically with the deposits 12 and do not undesirably damage the structure of the surrounding low k dielectric layer 18. For example, the increase in the k value of the layer 18 for a hydrogen-containing radical cleaning process may be less than about 0.1, and even less than about 0.05.

In contrast, hydrogen-containing ions, which are hydrogen-containing species having a positive or negative electrical charge, often energetically bombard the substrate 10, and thus can excessively damage the structure of the low-k dielectric layer 18 and increase the k value of the layer 18. Accordingly an improved cleaning process desirably exposes the substrate 10 to an energized gas comprising hydrogen-containing radicals and substantially no hydrogen-containing ions. For example, a suitable ratio of hydrogen-containing radicals to hydrogen-containing ions in the energized cleaning gas may be at least about 10,000:1.

The energized cleaning gas is formed by coupling energy to a suitable hydrogen-containing gas, such as for example one or more of $H_2$, $H_2O$, $NH_3$ and $SiH_4$. In order to form a high number of hydrogen-containing radicals, the cleaning gas desirably comprises a majority component of hydrogen-containing gas. For example, the cleaning gas can comprise at least about 80% by volume of a hydrogen-containing gas, and even at least about 90% by volume of a hydrogen-containing gas, such as for example 90% by volume of $H_2$. A suitable volumetric flow rate of the hydrogen-containing gas may be from about 100 sccm to about 5 Liters/minute. It has also been discovered that providing $H_2O$ can promote the formation of hydrogen-containing radicals in the energized gas and can also reduce corrosion of components in a chamber 106a. For example, the cleaning gas can comprise from about 1% to about 20% by volume of $H_2O$, such as from about 1% to about 5% by volume of $H_2O$. Accordingly, in one version, the cleaning gas comprises from about 50 sccm to about 1000 sccm of $H_2$, such as from about 300 to about 600 sccm of $H_2$, and from about 0 to about 10 sccm of $H_2O$, such as from about 1 to about 5 sccm of $H_2O$.

In one version, the cleaning gas comprises a nitrogen-containing gas. For example, the cleaning gas can comprise a composition of gas that dissociates to provide both hydrogen and nitrogen radicals. Examples of suitable cleaning gas compositions comprising nitrogen can include (i) $NH_3$, (ii) $NH_3$ and $H_2O$, (iii) $N_2$ and $H_2$, (iv) $N_2$, $H_2$ and $H_2O$, and (v) $NH_3$, $H_2O$ and $H_2$. In one version, the cleaning gas comprises from about 80% to about 100% by volume of $H_2$, from about 1% to about 20% by volume of $H_2O$, and from about 1% to about 20% by volume of $NH_3$. The cleaning gas can also comprise a carbon-containing gas to protect the low-k dielectric layer 18, by providing a source of carbon to replenish carbon etched away from the layer 18. Examples of suitable carbon-containing gases can include at least one of CO, $CH_4$, $CO_2$ and $C_2H_6$. The cleaning gas may also comprise an additive gas, such as at least one of $N_2$, Ar, He and Ne.

Figure 2A:
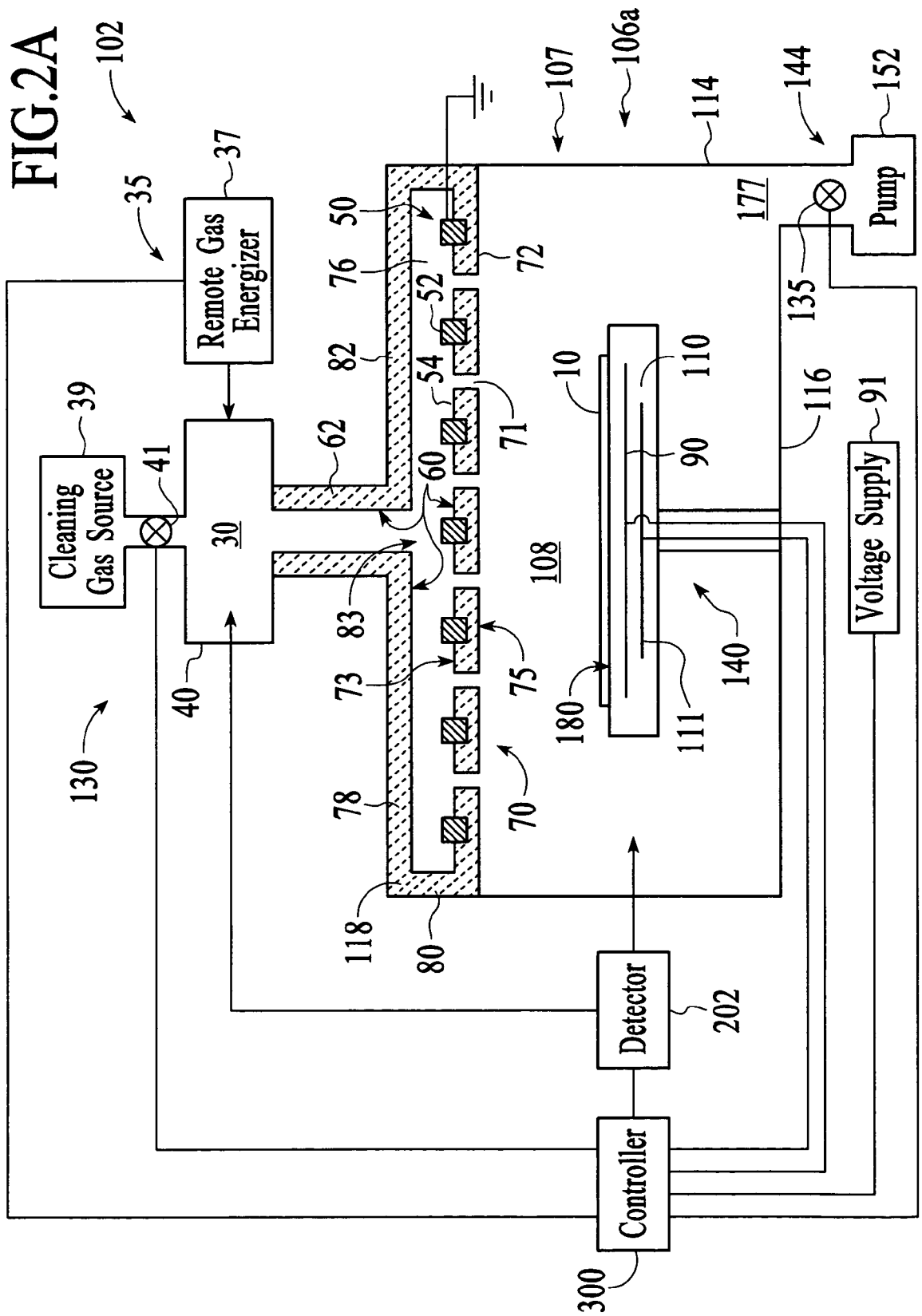
FIG. 2a is a sectional side view of an embodiment of a cleaning apparatus comprising an ion filter.

The cleaning gas can be energized by coupling energy to the gas in a remote zone 30, as shown for example in FIG. 2a, thereby forming a remotely energized gas comprising energized ionic and radical species. The remote zone 30 is located a suitable distance away from a process zone 108 of the cleaning chamber 106a, such that many of the energized ionic species formed in the remote zone 30 recombine before reaching the process zone 108. As radical species do not recombine as frequently and often have a longer average lifetime than ionic species over the same distance, forming the energized gas in the remote zone 30 allows for a greater number of radical species and fewer ionic species to be delivered into the process zone 108. The remote zone 30 is placed a distance d from the process zone 108, such that travel of the remotely energized gas across the distance d, for example from the remote zone 30 to a gas distribution plate 72, filters the gas to result in an energized gas having a reduced number of ionic species, and a higher ratio of the number of radical species to the number of ionic species. A suitable distance of the remote zone 30 from a process zone 108 of a cleaning chamber 106a may be, for example at least about 1.5 inches (3.8 cm), such as from about 1 inch (2.5 cm) to about 4 inches (10 cm.)

The energized cleaning gas is then passed through an ion filter 50 that filters the remotely energized gas to form a filtered energized gas having a ratio of ionic hydrogen-containing species to radical hydrogen-containing species that is different than a ratio of the species formed in the remote zone 30. Desirably, the ion filter 50 reduces the number of ionic species in the energized cleaning gas to provide a ratio of ionic to radical species in the filtered gas that is lower than a ratio of the unfiltered energized gas formed in the remote zone 30. The ratio of ionic to radical species in the filtered energized gas ($R_f$) may be lower than the unfiltered ratio ($R_i$) by at least about 1:100, such as at least about 1:500, and even at least about 1:10,000. The value of the unfiltered ratio ($R_i$) may be at least about 100 times the filtered ratio ($R_f$), such as at least about 500 times the filtered ratio, and even at least about 10,000 times the filtered ratio. For example, the filtered ratio can be equal to $R_f=(R_f/R_i)\cdot R_i$; where the filtered ratio is $R_f=I_f/N_f$ and the unfiltered ratio is $R_i=I_i/N_i$, with $I_f$ and $I_i$ being the number of ions in the filtered and unfiltered gas, respectively, and $N_f$ and $N_i$ being the number of radical species in the filtered and unfiltered gas, respectively. Written in terms of the numbers of ionic and radicals species, the filtered ratio is then equal to $R_f=(I_f/N_f)(N_i/I_i)\cdot R_i$. Assuming the number of radical species in the filtered and unfiltered gas stays substantially the same, that is, the number of radicals changes by less than about 20%, then $N_f$ is equal to $N_i$ and these factors cancel out of the equation, leaving the filtered ratio equal to $R_f=(I_f/I_i)R_i$. So the filtered ratio can be equal to the unfiltered ratio decreased by a factor that is substantially equal to the ratio of the number of filtered ions to the number of unfiltered ions ($I_f/I_i$), which is desirably a ratio of less than about 1:100, such as less than about 1:500, and even less than about 1:10,000. Thus, the ion filter 50 removes ionic species from the energized gas that could otherwise damage the low-k dielectric layer 18, while allowing radical species to remain in the energized cleaning gas to clean the substrate 10.

There are several methods of detecting the relative ratio of ionic species to radical species in the energized gas to determine whether a desired ratio has been obtained. Using plasma emission, the relative amount of hydrogen radicals can be monitored by detecting, for example, the intensity of the hydrogen emission spectra at 656 nm. The relative amount of hydrogen radicals in the energized gas is generally proportional to the intensity of the hydrogen emission line, and thus, a higher emission line intensity indicates a higher relative concentration of hydrogen radicals. The relative amount of hydrogen ions in the energized gas may be measured by, for example, measuring the change in DC bias of the substrate support 110. The number of hydrogen ions in the plasma that are impinging upon and charging the support 110 are proportional to the DC bias measured at the support 110. Thus, the ratio of the DC bias measured at the support 110 to the hydrogen emission line intensity can provide an estimate of the ratio of the ionic to radical hydrogen-containing species in the energized gas. The hydrogen ion concentration can also be measured with a langmuir probe which comprises a conductive probe tip that is inserted into the energized gas to measure parameters such as the ion current flux from the charge imparted by ions impinging on the tip. An example of a langmuir probe is described in U.S. Pat. No. 5,339,039 to Carlile et al., which is herein incorporated by reference in its entirety.

A detector 202 is provided that is capable of measuring the relative amounts and concentrations of at least one of the radical and ionic species using one or more the hydrogen emission intensity, the DC bias, a langmuir probe or another method. The detector 202 can be located at different regions of the chamber 106 and apparatus 102 to measure the concentrations of at least one of ions and radicals in that region. The detector 202 can be located in or about the remote chamber 40 to detect the amounts of one or more of radicals and ions in the unfiltered energized gas. For example, a detected concentration of ions in the unfiltered energized gas may be on the order of from about $10^{11}$ to about $10^{12}$ ions/cm$^3$. The detector 202 can also be located about the chamber 106a, for example near the process zone 108, to detect the amounts of one or more of ions and radicals in the filtered gas. For example, a detected concentration of ions in the filtered energized gas may be on the order of from about $10^8$ to about $10^9$ ions/cm$^3$. Accordingly, the numbers of at least one of ionic and radical species in different regions of the apparatus 102 can be measured by the detector 102 to determined the relative amounts of ionic and radical species in the filtered and unfiltered gases.

Figure 2B:
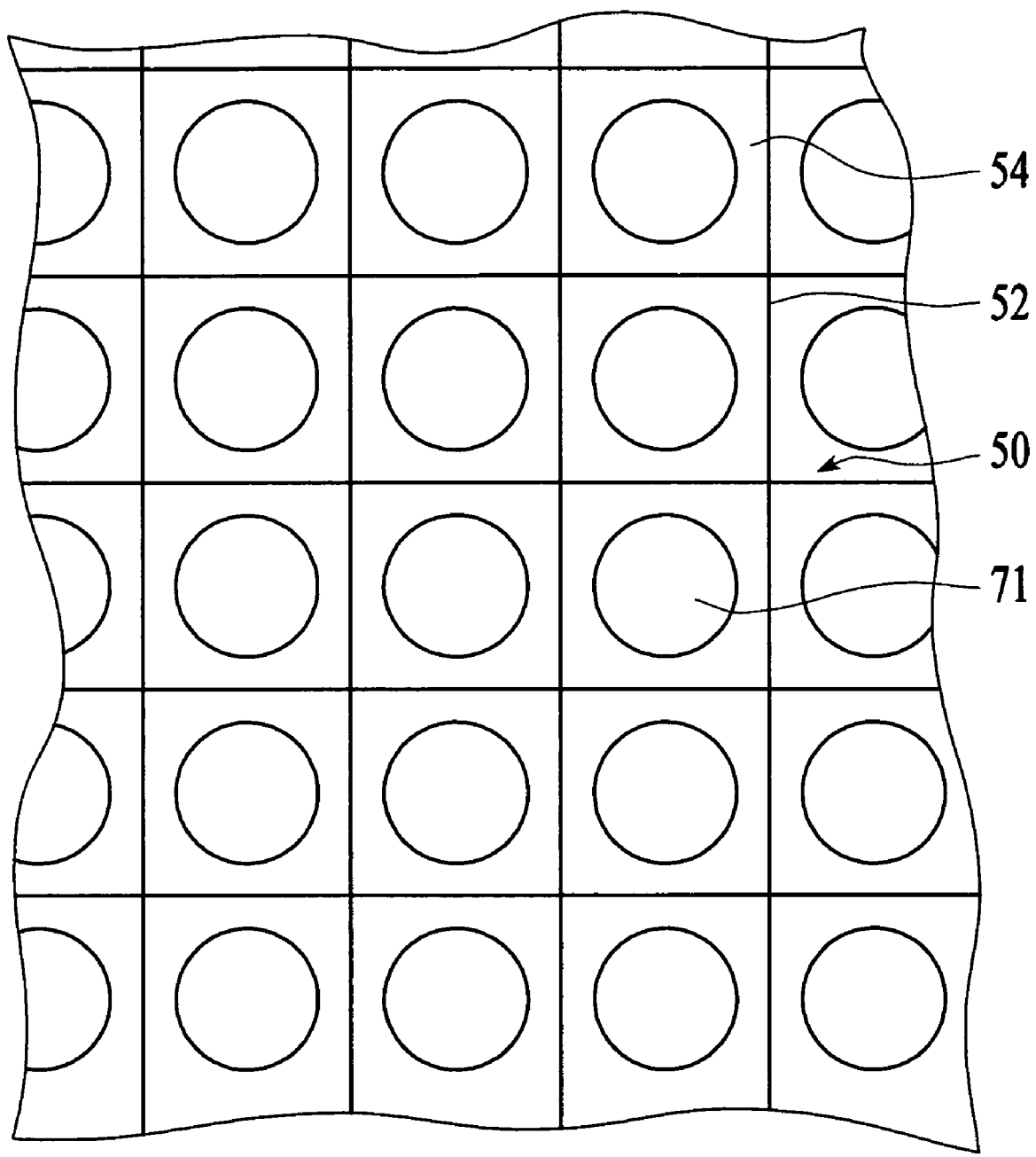
FIG. 2b is a partial top view of an embodiment of a wire grid mounted on a gas distribution plate.

In one version, the ion filter 50 comprises a conducting wire grid 52 having openings 54 therein through which the energized cleaning gas can pass, as shown in FIGS. 2a and 2b. The wire grid 52 can be electrically grounded (as shown) so that the charge from ionic species impinging on the grid 52 is conveyed through the grid 52 to the ground potential, thereby removing charged ionic species from the energized cleaning gas. The wire grid 52 can also optionally be biased to create an electrical potential zone that repels the charged ionic species. The wire grid 52 comprises a ratio of the area the openings 54 to the area of the wire grid 52 that is sufficiently high to allow a good flow of gas therethrough, such as a ratio of from about 10:1 to about 1:10, and even at least about 1:1. The wire grid 52 comprises a suitable electrically conducting material, such as for example, at least one of molybdenum, titanium, a nickel-chromium alloy and an aluminum alloy.

The wire grid 52 is placed in the flow path of the activated cleaning gas between the remote zone 30 and the substrate 10, for example above the process zone 108. In one version, as shown in FIGS. 2a and 2b, the wire grid 52 is mounted on a gas distribution plate 72 that distributes the energized cleaning gas received from the remote zone 30 into the process zone 108. The wire grid 52 is mounted on the gas distribution plate 72 such that the openings 54 in the wire grid coincide with apertures 71 in the gas distribution plate 72 to allow a flow of energized cleaning gas through the wire grid 52 and gas distribution plate 72. The wire grid 52 can be mounted on a top surface 73 of the gas distribution plate 72 and can even be at least partially embedded in the gas distribution plate 72, as shown in FIG. 2a, to inhibit corrosion of the wire grid 52. The gas distribution plate 72 desirably comprises a dielectric material, such as at least one of alumina, sapphire, silica and quartz, and can also comprise a conducting material, such as at least one of silicon, aluminum and silicon carbide. The wire grid can also or alternatively be mounted on a bottom surface 75 of the gas distribution plate 72, or can be spaced apart from the gas distribution plate 72. Also, the gas distribution plate 72 can itself act as an ion filter 50, as the plate 72 serves as a baffle that convolutes the flow of energized gas therethrough, thereby promoting the recombination of the energized radical species.

The energized cleaning gas can also be filtered to remove ionic species by passing the energized gas over a surface 60 comprising quartz. The quartz surface 60 is believed to act as an ion filter 50 to reduce the recombination of the radicals by providing a surface with which hydrogen-containing species can hydrogen bond and adsorb onto the surface 60. Hydrogen-containing species that impinge on the quartz surface 60 release an adsorbed hydrogen-containing radical into the energized gas, thereby regenerating the hydrogen radicals. The hydrogen ions are not regenerated by the quartz surfaces 60, and thus these ions recombine to form electrically neutral, non-ionic species. Thus, by passing the activated cleaning gas over the quartz surface, the ionic species are effectively filtered from the energized cleaning gas, while the radical species are preserved.

The quartz surfaces 60 can be arranged to provide optimal filtering of the hydrogen ion species from the energized cleaning gas. In one version, the quartz surfaces 60 comprise the interior surface of a portion of a connecting conduit 62 between the remote zone 30 and the process chamber 100, as shown in FIG. 2a. For example, the connecting conduit 62 can comprise a quartz tube. In another version, the quartz surface 60 comprise one or more surfaces of a gas distributor 70, as is also shown in FIG. 2a. For example, the gas distributor 70 can comprise a gas distribution plate 72 that comprises quartz. The quartz surfaces 60 can also be on surfaces of walls 78,80 surrounding a gas distribution plenum 76 that is between the gas distribution plate 72 and a gas distributor inlet 83. For example, the upper and side plenum walls 78,80 can be made of quartz. The plenum walls 78, 80 can also comprise liners 82 that line the walls 78, 80 and comprise the quartz surfaces 60, such as quartz liners. The liners 82 comprising the quartz surfaces 60 can also line other surfaces in the chamber 100, such as a surface of a portion of at least one of a chamber sidewall 114, bottom wall 116, ceiling 118, and other components such as the gas distribution plate 72.

The temperature of the substrate 10 is set to provide optimum conditions for the reduction of oxides in the deposits 12, and can even be set to accelerate the chemical reaction between the hydrogen-containing radicals and the deposits 12. For example, the temperature of the substrate may be maintained at from about 0 to about 500° C., such as from about 150° C. to about 450° C., and even from about 25° C. to about 350° C., such as from about 150° C. to about 350° C. In one version, a bias power level applied to the substrate 10 during the cleaning process may be desirably low, as a high bias power level can increase the bombardment of the substrate 10 by ions in the energized cleaning gas. A suitable bias power level may be less than about 100 Watts, such as from about to about 0 to about 10 Watts, and even from about 1 Watts to about 10 Watts, and may even be substantially zero. In another version, a higher bias power level may be applied to increase the rate of cleaning, such as a bias power level of greater than 100 Watts, and even from about 100 Watts to about 200 Watts.

It has further been discovered that cleaning of the substrate 10 can be improved by performing a heat treatment or annealing step to remove deposits 12 from the substrate 10. In the heat treatment step, the substrate 10 is heated to a temperature that is sufficiently high to de-gas material from the substrate 10, for example by vaporizing the deposits 12. A flow of a reducing gas may also be provided during the heat treatment step to inhibit the formation of oxides on the substrate 10. A suitable reducing gas may comprise a hydrogen-containing gas, such as for example $H_2$. The heat treatment step can be performed substantially without energizing the reducing gas, for example substantially without coupling RF or microwave energy to the reducing gas, to provide a relatively gentle initial clean of the substrate 10 prior to the remotely energized hydrogen radical cleaning step.

In one version of a heat treatment step, the substrate 10 is heated to a temperature of at least about 100° C., such as from about 150° C. to about 350° C. A flow of $H_2$ is provided in a volumetric flow rate of from about 100 sccm to about 5 Liters/minute. A pressure during the heat treatment step may be maintained at from about 100 mTorr to about 100 Torr, and even at less than about 30 Torr, and a suitable heating duration may be from about 1 to about 10 minutes.

In one version, the heat treatment step is performed in the same chamber 106a as the hydrogen radical cleaning step. For example, the chamber 106a can comprise a temperature control system 140 with a heater 142 adapted to heat the substrate 10 to the heat treatment temperature in the chamber 106a. In the embodiment shown in FIG. 2a, heater 142 comprises a resistive heating element 111 below the substrate 10 in a substrate support 110. The heater 142 can also comprise other heating devices, such as for example an overhead heating lamp 143. In another version, the heat treatment step is performed in a separate heat treatment chamber 106c, an embodiment of which is shown in FIG. 2c. The heat treatment chamber 106c is desirably in vacuum contact with the cleaning chamber 106a, for example via a vacuum transfer chamber 117, such that the substrate 10 can be transferred from the heat treatment chamber 106c to the cleaning chamber 106a without breaking vacuum.

In one embodiment, the cleaning process, and optionally the heat treatment process, are performed after the resist layer 22 is substantially entirely removed to expose a surface 19 of the underlying low-k dielectric layer 18. A stripping process can comprise exposing the substrate 10 comprising the resist layer 22, as shown in FIG. 1a, to an energized stripping gas such as an oxygen-containing gas in a stripping chamber. Once stripping of the resist layer 22 has been completed and the resist layer 22 is substantially entirely removed, as shown in FIG. 1b, the substrate 10 is transferred to a separate cleaning chamber 106a. The cleaning chamber 106a is desirably a part of a separate multichamber apparatus that is not in vacuum contact with the stripping chamber, as the stripping process can involve the bulk removal of large amounts of material from the substrate 10, and thus vacuum integration of the stripping chamber with the cleaning chamber 106a or other chamber can result in contamination from the stripping chamber. When a separate heat treatment chamber 106c is used, the heat treatment chamber 106c is also desirably not in vacuum contact with the stripping chamber, and can be a part of the multichamber vacuum apparatus including the cleaning chamber 106a. The native oxide component of the deposits 12 can form on the surface 14 of the metal-containing conductor 16 upon exposure of the metal-containing conductor 16 to the oxygen-containing stripping environment, or upon exposure to ambient atmosphere in the transfer of the substrate 10 from the stripping chamber to the cleaning chamber 106a, as shown in FIG. 1b.

In one version of a suitable cleaning process, a cleaning gas comprising from about 50 to about 1000 sccm of $H_2$, such as 300 sccm of $H_2$, and from about 0 to about 10 sccm $H_2O$, such as 3 scm $H_2O$ is activated in the remote source 35 by applying a power level of from about 300 Watts to about 3000 Watts, such as 1050 Watts. The chamber pressure is maintained at less than about 10 Torr, such as about 1 Torr. A bias power level of from about 0 to about 100 Watts, such as 50 Watts is applied to bias the substrate 10, and the temperature of the substrate 10 is maintained at from about 150 to about 450° C., such as 250° C. The cleaning process substantially removes the deposits 12 to provide a cleaned surface 14, as shown in FIG. 1c.

After the cleaning process has been completed, the pressure in the chamber 106a is reduced to a pressure of less than about 10 mTorr, to evacuate spent cleaning gas and cleaning by-products and to reduce the likelihood of contamination of the multichamber apparatus by the cleaning chamber 106a. The substrate 10 can then be transferred under vacuum via a substrate transfer chamber 117 having a transfer robot 119 to a deposition chamber 106b to deposit a second metal-containing conductor 21, such as at least one of copper, aluminum, tantalum, tungsten, tantalum nitride and tungsten nitride, on the freshly cleaned metal-containing conductor surface 14, as shown in FIG. 1d.

An embodiment of an apparatus 102 comprising a cleaning chamber 106a suitable for the hydrogen-containing radical cleaning process is shown in FIG. 2a. The particular embodiment of the apparatus 102 shown herein is suitable for cleaning substrates 10, such as semiconductor wafers, and may be adapted by those of ordinary skill to clean other substrates 10, such as flat panel displays, polymer panels, or other electrical circuit receiving structures. Generally, the cleaning chamber 106a comprises one or more walls 107, such as an enclosure wall, which can comprise a ceiling 118, sidewalls 114, and a bottom wall 116 that enclose a process zone 108. Energized cleaning gas is provided to the process zone 108 by a gas supply 130 comprising the remote source 35 and a gas distributor 70. The cleaning gas is energized by the remote source 35 and received by the gas distributor 70 via a connecting conduit 62 having an inlet 83. The gas distributor 70 can comprise a gas distribution plate 72 having apertures 71 therein to distribute the gas in the process zone 108. The gas distributor 70 can also optionally comprise one or more conduits around a periphery of the substrate 10. Spent gas and byproducts are exhausted from the chamber 106a through an exhaust system 144 which may include an exhaust port 177 that receives gas from the process zone 108, and can also include a throttle valve 135 to control the pressure of gas in the chamber 106a, and one or more exhaust pumps 152, such as a turbo-molecular exhaust pump. The exhaust system 144 can be capable of maintaining a sub-atmospheric pressure in the chamber 106a.

A remote source 35 suitable for remotely energizing the cleaning gas comprises a remote chamber 40 having the remote zone 30, a cleaning gas source 39 and a remote gas energizer 37. In operation, the cleaning gas is received from the cleaning gas source 39 in the remote chamber 40. A flow valve 41 can be provided to control a flow rate of the cleaning gas into the remote chamber 40. The remote gas energizer 37 couples energy to the cleaning gas in the remote zone 30 to energize the cleaning gas, thereby forming an energized cleaning gas comprising energized ionic and radical species. The remote gas energizer 37 can couple, for example, at least one of RF and microwave energy to the cleaning gas. In one version, the remote gas energizer 37 comprises an inductor antenna that inductively couples RF energy to the cleaning gas in the remote zone 30. A suitable RF power level to couple to the cleaning gas may be from about 100 Watts to about 10 kWatts. In another version, the remote gas energizer 37 comprises a toroidal gas energizer to couple energy to the cleaning gas in the remote zone 30, as described for example in U.S. Pat. No. 6,150,628 to Smith et al., herein incorporated by reference in its entirety. A suitable RF power level applied by the toroidal gas energizer may be from about 1000 Watts to about 10,000 Watts. A remote gas energizer 37 comprising a microwave gas activator can also be provided. A suitable microwave power level may be from about 300 Watts to about 5 kWatts. The chamber 106a may also optionally comprise a chamber gas energizer that couples energy to the gas in the process zone 108 of the chamber 106a. For example, the chamber gas energizer can comprise one or more of electrodes and an inductor antenna to couple RF energy.

The substrate 10 is held in the process zone 108 on a support 110 having a substrate receiving surface 180. The support 110 can optionally comprise an electrode 90 that can be electrically biased by applying a power level from a voltage supply 91. The electrode 90 can be biased to electrostatically hold the substrate 10 on the support 110. The electrode 90 and substrate 10 can also be biased to affect characteristics of the process, such as the degree of ion bombardment of the substrate 10. However, the support 110 can also be absent any chargeable electrode. A temperature control system 140 is provided to maintain a temperature of the substrate 10, and can comprise, for example, a resistive heating element 111 in the support 110 beneath the substrate 10. The temperature control system 140 can also comprise one or more other heat-exchanging devices, such as a heat exchange conduit in which heat exchange fluid is provided, and heating lamps. The temperature control system 140 can also comprise a temperature monitor, such as a thermocouple, that monitors the temperature of the substrate 10, and provides a signal in relation to the temperature to a chamber controller 300.

Figure 3:
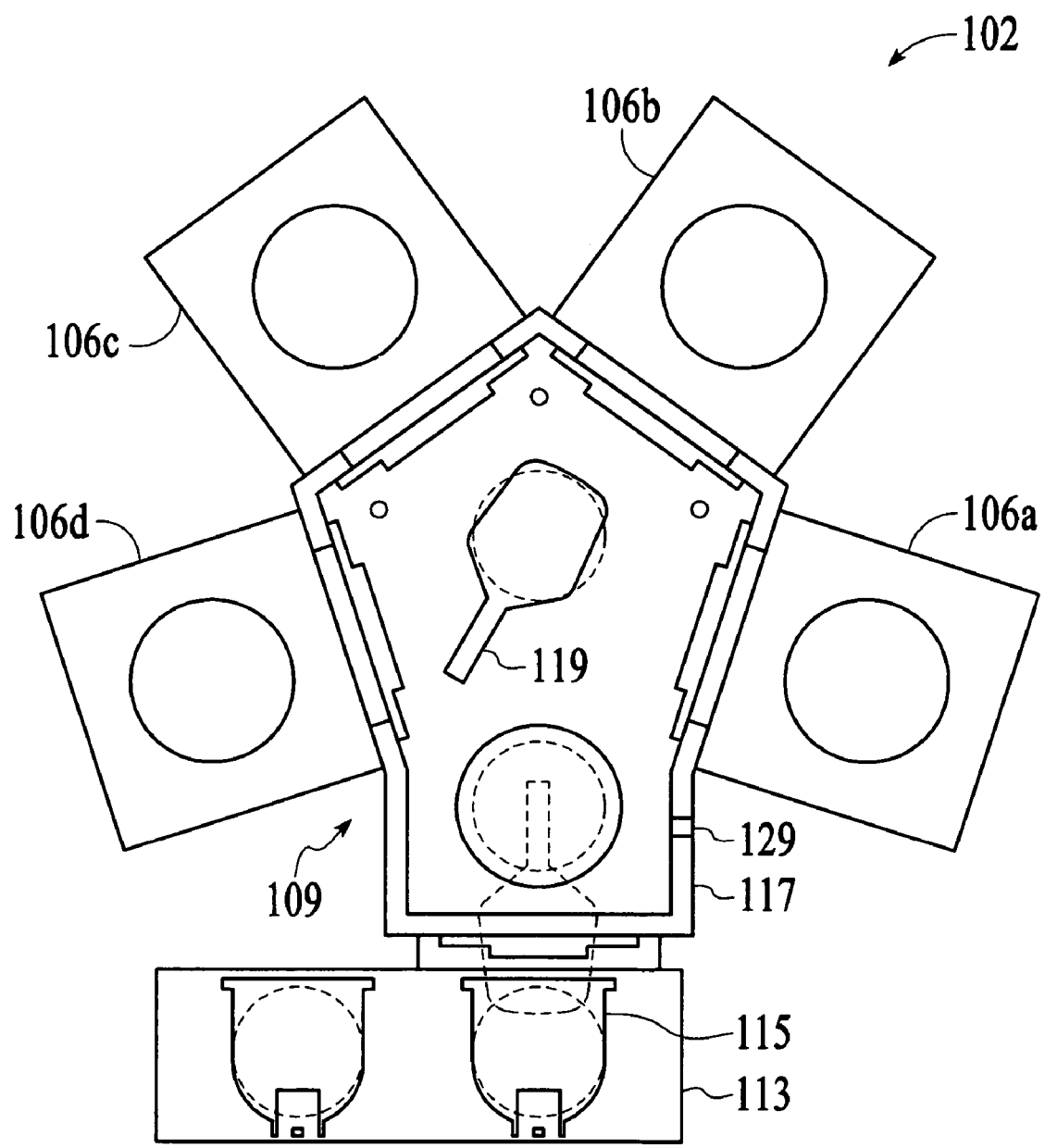
FIG. 3 is a sectional top view of an embodiment of multi-chamber apparatus.

The apparatus 102 comprising the processing chamber 195 can also be a part of a larger multi-chamber apparatus 102 comprising a plurality of processing chambers 106a-d. An embodiment of an apparatus 102 suitable for processing substrates 10 comprises one or more processing chambers 106a-d, as shown in FIG. 3. The chambers 106a-d are mounted on a platform, such as a Precision 5000™ platform from Applied Materials, Inc., of Santa Clara, Calif., that provides electrical, plumbing, and other support functions. The platform 109 typically supports a load lock 113 to receive a cassette 115 of substrates 10 to be processed and a substrate transfer chamber 117 containing a robot 119 to transfer substrates from the cassette 115 to the different chambers 106a-d for processing and return them after processing. The different chambers 106a-d may include, for example, a deposit cleaning chamber 106a, a deposition chamber 106b for depositing materials on wafers, optionally, a heat treatment chamber 106c, and other processing chambers. For example, in one version, one of the chambers 106a-d comprises the cleaning chamber 106a for removing deposits 12 formed on a metal-containing conductor 16 on the substrate 10. After the cleaning process is finished, the substrate 10 can be transferred by the robot 119 to a deposition chamber 106b to deposit material such as a metal-containing conductor on the cleaned substrate 10. The substrate 10 can also be transferred by the robot 119 to a second deposition chamber 106 capable of depositing another material, such as another metal-containing conductor, over the first material deposited in the first chamber. Also, the substrate 10 can be transferred by the robot 119 from a heat treatment chamber 106c to the cleaning chamber 106a after a heat treatment process. The chambers 106a-d are interconnected to form a continuous vacuum environment within the apparatus 102 in which the process may proceed uninterrupted, thereby reducing contamination of substrates 10 that may otherwise occur when transferring wafers between separate chambers for different process stages. The transfer chamber 117 comprises an exhaust system having an outlet 129 to exhaust gases and to maintain a low pressure environment, such as a pressure of less than about 10 mTorr, in order to reduce contamination of the chambers 106a-d.

Figure 4A:
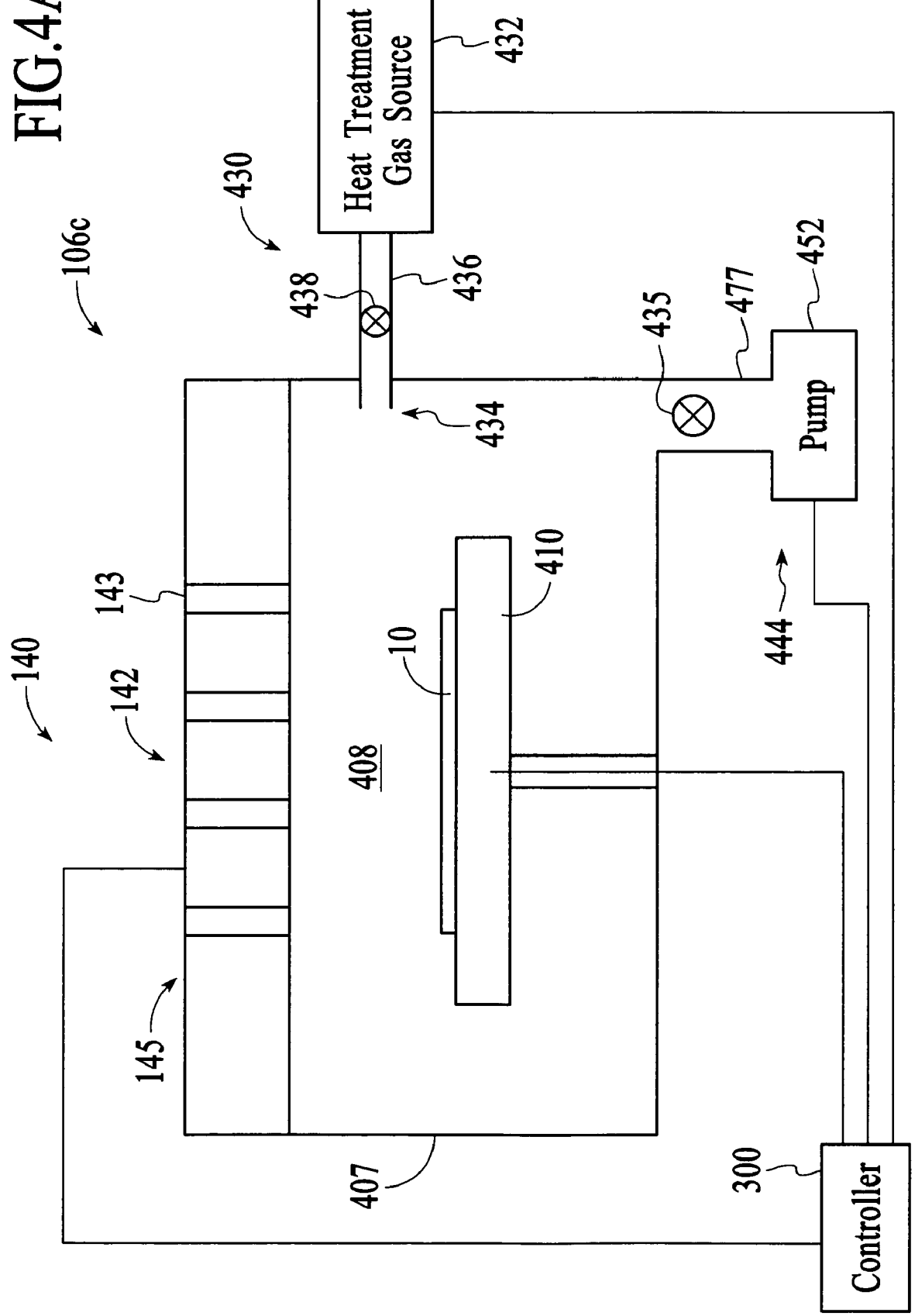
FIG. 4a is a sectional side view of an embodiment of a heat treatment chamber.
Figure 4B:
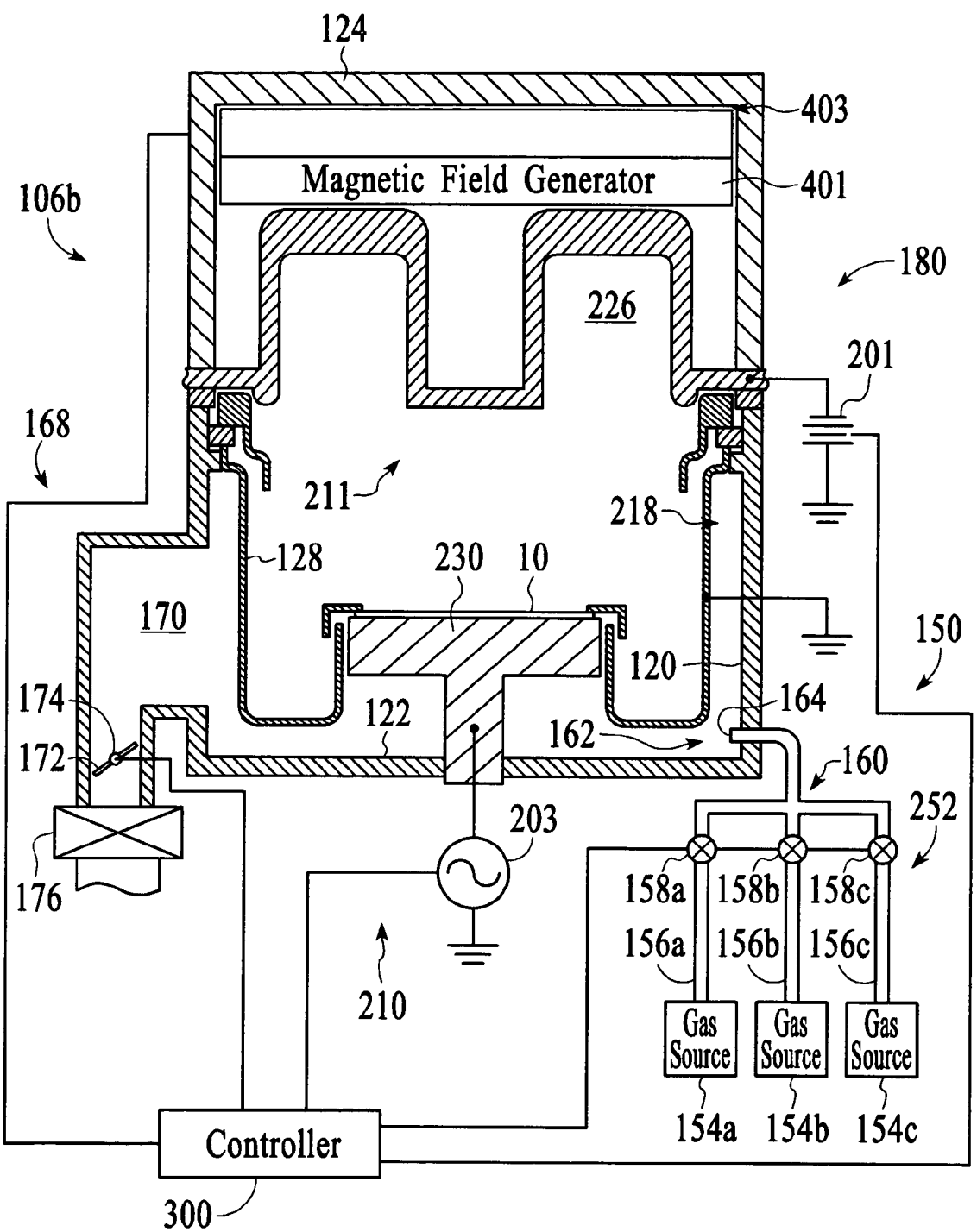
FIG. 4b is a sectional side view of an embodiment of a sputtering chamber.

An exemplary version of a chamber 106b capable of depositing material on a substrate 10 is schematically illustrated in FIG. 4b. The chamber 106b is representative of a self-ionized plasma chamber, such as an SIP+ type chamber, developed by Applied Materials, Inc. of Santa Clara, Calif. However, aspects of the invention are not limited to a deposition chamber comprising an SIP+ type chamber, and other deposition chambers are also suitable. A typical chamber 106b comprises enclosure walls 218 that include sidewalls, 120, a bottom wall 122 and a ceiling 124. A substrate support 230 is provided to support a substrate 10 in the chamber 106b. The substrate support 230 may be electrically floating or may be biased by a pedestal power supply 210, which may be for example an RF power supply 203. The substrate 10 is introduced into the chamber 106b through a substrate loading inlet (not shown) in a sidewall 120 of the chamber 106b and placed on the support 230. The support 230 can be lifted or lowered by support lift bellows (not shown) and a lift finger assembly (also not shown) can be used to lift and lower the substrate 10 onto the support 230 during transport of the substrate 10 into and out of the chamber 106b.

A process gas, such as a sputtering gas, is introduced into the chamber 16b0 through a process gas supply 252 comprising gas sources 154a-c that each feed a conduit 156a-c having a gas flow control valve 158a-c, such as a mass flow controller, to pass a set flow rate of the gas therethrough. The conduits 156a-c feed the gases to a mixing manifold 160 in which the gases are mixed to from a desired process gas composition. The mixing manifold 160 feeds a gas distributor 162 having one or more gas outlets 164 in the chamber 106b. The gas outlets 164 may pass through the chamber sidewalls 120 to terminate about a periphery of the substrate support 230. The process gas may comprise a non-reactive gas, such as argon or xenon, that energetically impinges upon and sputters material from a target 211. The process gas may also comprise a reactive gas, such as one or more of an oxygen-containing gas and a nitrogen-containing gas, that are capable of reacting with the sputtered material to form a layer on the substrate 10. Spent process gas and byproducts are exhausted from the chamber 106b through an exhaust system 168 which includes one or more exhaust ports 170 that receive spent process gas, and which may pass the spent gas to an exhaust conduit 172 in which there is a throttle valve 174 to control the pressure of the gas in the chamber 106b. The exhaust conduit 172 feeds one or more exhaust pumps 176. Typically, the pressure of the sputtering gas in the chamber 106b is set to sub-atmospheric levels.

The sputtering chamber 106b further comprises a sputtering target 211 facing the substrate 10. The sputtering target 211 can comprise a desired shape, such as the shape shown in FIG. 4b. The sputtering target 211 can also comprise a substantially planar shape with a substantially planar sputtering surface. The sputtering chamber 106b can also comprise a shield 128 to protect a wall 218 of the chamber 106b from sputtered material, and typically, to also serve as an anode with respect to the cathode target 211. The shield 128 may be electrically floating or grounded. The target 211 is electrically isolated from the chamber 106b and is connected to a target power supply 201, such as a pulsed DC power source, but which may also be other types of voltage sources. In one version, the target power supply 201, target 211, and shield 128 operate as a gas energizer 180 that is capable of energizing the sputtering gas to sputter material from the target 211. The target power supply 201 applies a bias voltage to the target 211 relative to the shield 128. The electric field generated in the chamber 106b from the voltage applied to the sputtering target 211 energizes the sputtering gas to form a plasma that energetically impinges upon and bombards the target 211 to sputter material off the target and onto the substrate 10. A suitable pulsing frequency of a pulsed DC voltage for energizing the process gas may be, for example, at least about 50 kHz, and more preferably less than about 300 kHz, and most preferably about 100 kHz. A suitable DC voltage level to energize the process gas may be, for example, from about 200 to about 800 Volts.

The chamber 106b further comprises a magnetron 403 comprising a magnetic field generator 401 that generates a magnetic field near the target 211 of the chamber 106b to increase an ion density in a high-density plasma region 226 adjacent to the target 211 to improve the sputtering of the target material. An improved magnetron 403 may be used to allow sustained self-sputtering of copper or sputtering of aluminum, titanium, or other metals—while minimizing the need for non-reactive gases for target bombardment purposes, as for example, described in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated herein by reference in their entirety.

An embodiment of the optional heat treatment chamber 106c is shown in FIG. 4b. The heat treatment chamber comprises enclosure walls 407 that enclose a process zone 408. Heat treatment gas is provided to the process zone 408 by a gas delivery system 430 comprising, for example, a source of heat treatment gas 432 and a gas distributor 434 that receives heat treatment gas from the source via a connecting conduit 436. The gas delivery system 430 can further comprise a flow meter 438 to control a flow of gas into the process zone 408. The substrate 10 is held in the process zone 408 on a support 410. The support 410 can optionally comprise an electrode (not shown) that can be electrically biased to hold the substrate 10 on the support 410. Spent gas and byproducts are exhausted from the chamber 106c through an exhaust system 444 which may include an exhaust port 477 that receives gas from the process zone 408, and may also include a throttle valve 435 to control the pressure of gas in the chamber 106a, and one or more exhaust pumps 452, such as a turbo-molecular exhaust pump.

The heat treatment chamber 106c comprises a temperature control system 140 having a heater 142 that is capable of heating the substrate 10 to a desired temperature, and maintaining the substrate 10 at the desired temperature. In the embodiment shown in FIG. 4a, the heater 142 comprises an array 445 of heating lamps 143 adapted to direct heating radiation onto the surface of the substrate 10. The temperature control system 140 can also comprise one or more other heating devices, such as a resistive heating element in the support 410 or a heat exchange conduit in which heat exchange fluid is provided. The temperature control system 140 can also comprise a temperature monitor, such as a thermocouple, that monitors the temperature of the substrate 10, and provides a signal in relation to the temperature to a chamber controller 300.

Figure 5:
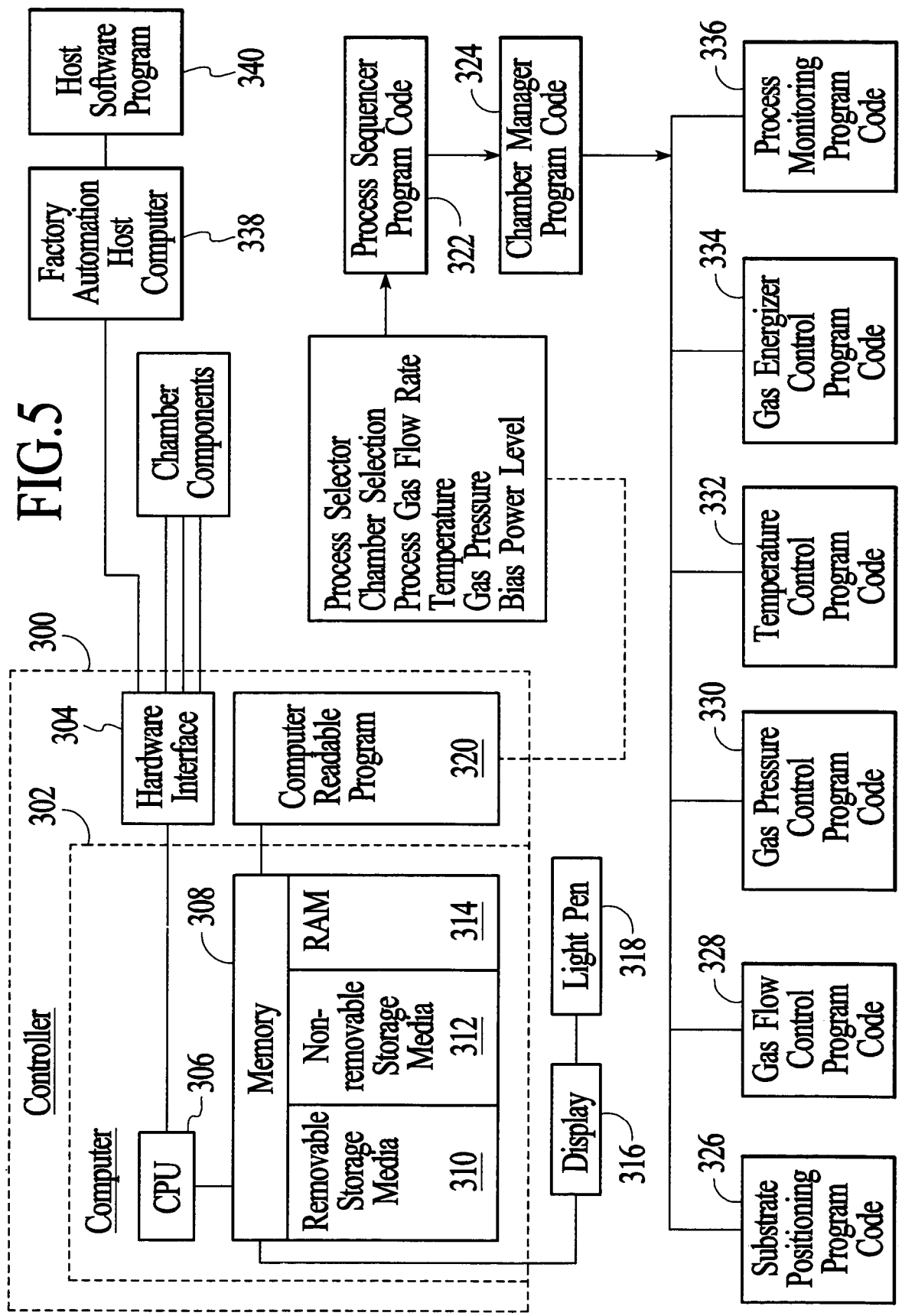
FIG. 5 is a illustrative block diagram of a controller comprising a computer readable program.

The multi-chamber apparatus 102 can be operated by a controller 300 via a hardware interface 304, as shown in FIG. 5. The controller 300 comprises a computer 302 having a central processor unit (CPU) 306, such as for example a 68040 microprocessor, commercially available from Synergy Microsystems, California, or a Pentium Processor commercially available from Intel Corporation, Santa Clara, Calif., that is coupled to a memory 308 and peripheral computer components. Preferably, the memory 308 may include a removable storage media 310, such as for example a CD or floppy drive, a non-removable storage media 312, such as for example a hard drive, and random access memory 314. The controller 300 may further comprise a plurality of interface cards including, for example, analog and digital input and output boards, interface boards, and motor controller boards. The interface between an operator and the controller 300 can be, for example, via a display 316 and a light pen 318. The light pen 318 detects light emitted by the monitor display 316 with a light sensor in the tip of the light pen 318. To select a particular screen or function, the operator touches a designated area of a screen on the monitor 316 and pushes the button on the light pen 318. Typically, the area touched changes color, or a new menu is displayed, confirming communication between the user and the controller 300.

In one version the controller 300 comprises a computer-readable program 320 may be stored in the memory 308, for example on the non-removable storage media 312 or on the removable storage media 310. The computer readable program 320 generally comprises process control software comprising program code to operate the chambers 106a-d and their components, the transfer chamber 117 and robot 119, process monitoring software to monitor the processes being performed in the chambers 106a-d, safety systems software, and other control software, as for example. The computer-readable program 320 may be written in any conventional computer-readable programming language, such as for example, assembly language, C++, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of precompiled library routines. To execute the linked, compiled object code, the user invokes the object code, causing the CPU 306 to read and execute the code to perform the tasks identified in the program.

Figure 10:
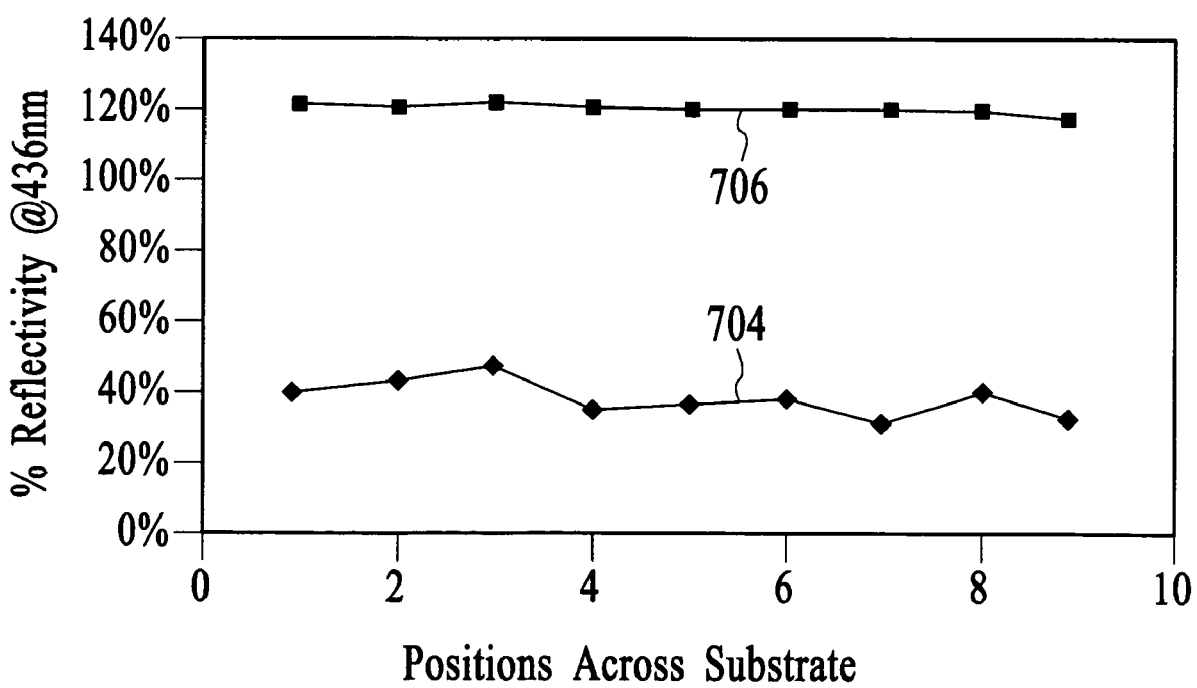
FIG. 10 is a graph of the percent reflectivity measured across a substrate before and after a substrate cleaning process.

An illustrative block diagram of a hierarchical control structure of a specific embodiment of a computer readable program 320 is shown in FIG. 10. Using a light pen interface, a user enters a process set and chamber number into the computer readable program 320 in response to menus or screens displayed on the CRT terminal. The computer readable program includes program code to control the substrate position, gas flow, gas pressure, temperature, RF power levels, and other parameters of a particular process, as well as code to monitor the chamber process. The process sets are predetermined groups of process parameters necessary to carry out specified processes. The process parameters are process conditions, including without limitations, gas composition, gas flow rates, temperature, pressure, gas energizer settings such as RF power levels.

The process sequencer program code 322 comprises program code to accept a chamber type and set of process parameters from the computer readable program 320 and to control its operation. The sequencer program code 322 initiates execution of the process set by passing the particular process parameters to a chamber manager program code 324 that controls multiple processing tasks in the process chamber 106a-d. Typically, the process chamber program code 324 includes a substrate positioning program code 326, a gas flow control program code 328, a gas pressure control program code 330, a temperature control program code 332, a gas energizer control program code 334, and a process monitoring program code 336.

Typically, the substrate positioning program code 326 comprises instructions for controlling chamber components that are used to load the substrate 10 onto the support 110,230 in the chambers 106a-d, and optionally, to lift the substrate 10 to a desired height in the chamber 106a-d. The substrate positioning program code 334 can also control the robot 119 in the transfer chamber 117 to transfer the substrate 10 between chambers in the multi-chamber apparatus 102. The gas flow control program code 328 comprises instructions for controlling the flow rates of different constituents of process gas, such as cleaning gas, heat treatment gas or sputtering gas. The gas flow control program code 328 regulates the opening size of one or more gas flow valves 41, 158a,c and 436 to obtain the desired gas flow rate into the chambers 106a-c.

The temperature control program code 332 comprises program code for controlling temperatures in the chambers 106a-d, such as the temperature of the substrate 10. For example, the temperature control program code can control the temperature of a substrate 10 in the cleaning chamber 106a by controlling a current applied to a heater 142, such as the resistive heating element 111 in the support, and monitoring a signal from a temperature sensor to maintain a desired temperature. The temperature control program code can similarly control the temperature of the substrate 10 in a separate heat treatment chamber 106c, by controlling a current applied to the heater 142 and monitoring the substrate temperature. The gas energizer control program code 334 comprises instructions for controlling gas energizers, such as the remote gas energizer 37 and sputtering gas energizer 180, for example by setting a power level applied to energize the gas. The process monitoring program code 334 comprises instructions for monitoring the process in the chambers 106a-d, such as for example monitoring the ratio of ionic to radical species in one or more of the unfiltered and filtered energized gas via the detector 202. The pressure control program code 330 comprises instructions for controlling the pressure in the chambers 106a-d and transfer chamber 117, for example by controlling the throttle valves 174, 135 and 477.

In one version, the controller comprises program code to operate the cleaning chamber 106a, sputtering chamber 106b, and robot 119, to clean deposits 12 from a first metal-containing conductor 116 on the substrate 10 in the cleaning chamber 106a, transfer the substrate 10 to the sputtering chamber 106b, and deposit a second metal-containing conductor 21 on the cleaned first metal-containing conductor 16. The controller 300 can also optionally comprise program code to operate the heat treatment chamber 106c to perform an initial heat treatment step before transferring the substrate 10 to the cleaning chamber 106a to clean the deposits 12.

The data signals received by and/or evaluated by the controller 300 may be sent to a factory automation host computer 338. The factory automation host computer 318 may comprise a host software program 340 that evaluates data from several systems, platforms or chambers 106a-d, and for batches of substrates 10 or over an extended period of time, to identify statistical process control parameters of (i) the processes conducted on the substrates 10, (ii) a property that may vary in a statistical relationship across a single substrate 10, or (iii) a property that may vary in a statistical relationship across a batch of substrates 10. The host software program 340 may also use the data for ongoing in-situ process evaluations or for the control of other process parameters. A suitable host software program comprises a WORKSTREAM™ software program available from aforementioned Applied Materials. The factory automation host computer 338 may be further adapted to provide instruction signals to (i) remove particular substrates 10 from the processing sequence, for example, if a substrate property is inadequate or does not fall within a statistically determined range of values, or if a process parameter deviates from an acceptable range; (ii) end processing in a particular chamber 106a-d, or (iii) adjust process conditions upon a determination of an unsuitable property of the substrate 10 or process parameter. The factory automation host computer 338 may also provide the instruction signal at the beginning or end of processing of the substrate 10 in response to evaluation of the data by the host software program 340.

EXAMPLES

The following examples demonstrate the improved cleaning results provided by energized hydrogen-containing radicals. In the examples, the substrates 10 comprised a copper conductor 16, having a low-k dielectric layer formed thereover. The copper conductor 16 had a layer of copper oxide 12 thereon that was exposed through features 20 in the low-k dielectric layer 18. Changes in the k value of the dielectric layer were measured using an Hg probe.

Example 1

This example demonstrates the effect on the k value of a conventional cleaning process for different thicknesses of low-k dielectric. The conventional cleaning process comprised providing a cleaning gas comprising 95% He and 5% $H_2$ in a process zone; inductively coupling an RF power level of 450 Watts to the cleaning gas in the process zone; maintaining a pressure in the chamber of 80 mTorr; and applying a bias power level of 10 Watts. The substrate 10 was exposed to the cleaning gas for 40 seconds. Table 1 below shows the change in k value as a function of the thickness of the low-k dielectric layer.

TABLE 1

| Thickness (Å) | Δk (%) |
|---|---|
| 1000 | 14.4 |
| 1500 | 12.7 |
| 5000 | 2.3 |

Table 1 shows that the change in the k value of the cleaned substrates 10 increases with decreasing thickness of the low-k dielectric layer 18. It is believed that the steep increase in the k value at smaller thicknesses, such as at or below 1500 Å, is due to the fact that the top surface 19 of the low-k dielectric layer 18 is the area that is most heavily damaged by the conventional cleaning process. As the bulk dielectric layer thickness decreases, the capacitance of this top surface 19 contributes more to the overall capacitance of the layer 18. Thus, conventional processes fail to provide satisfactory cleaning of substrates having low-k dielectric layers 18, and especially low-k dielectric layers 18 having thicknesses of about and less than about 1500 Å.

Example 2

Figure 6:
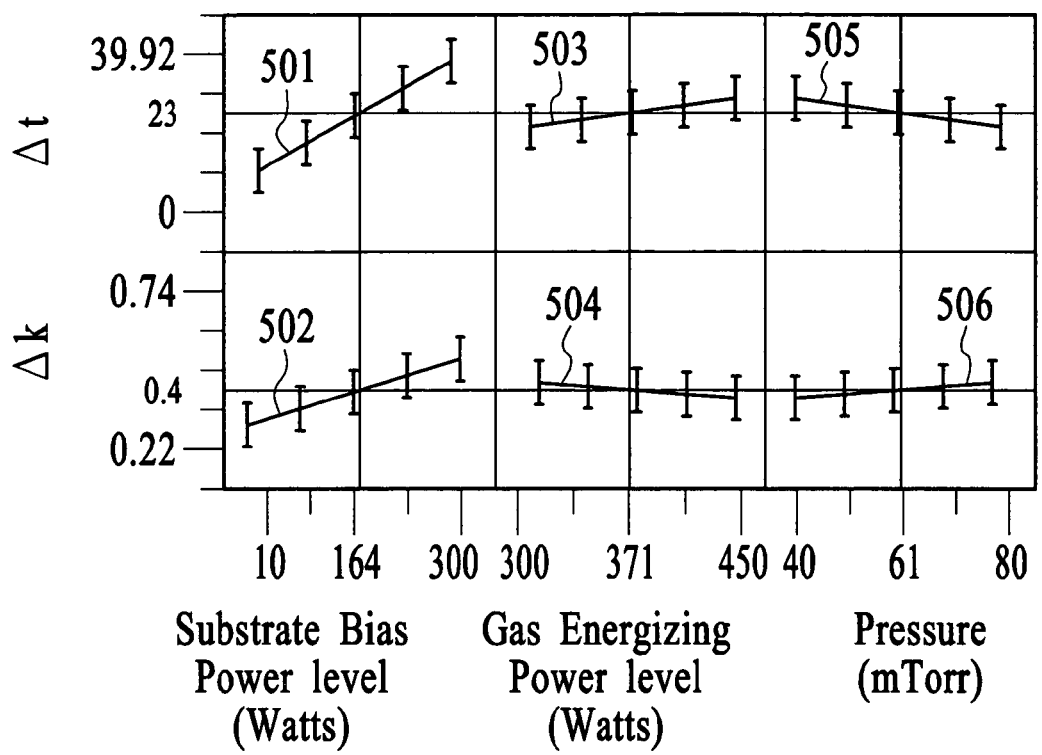
FIG. 6 is a graph showing the change in thickness and change in k value of a low-k dielectric layer for increasing substrate bias power level, gas energizing power level and pressure.

Example 2 demonstrates the effect of various process parameters on a cleaning process. In these examples, a substrate 10 having a starting low-k dielectric layer thickness of 1500 Å was subjected to a conventional cleaning process in which the energized cleaning gas was formed in the process zone and the cleaning gas was not filtered to reduce the number of ions. A multi-factorial test was performed with varying process parameters including the substrate bias power level, the gas energizing power level, and the gas pressure. FIG. 6 shows the change in thickness ($\Delta t$) of the low-k dielectric layer and the change in the k value ($\Delta k$) for the substrates 10 processed under the multifactorial conditions.

FIG. 6 shows that the substrate bias power level has a strong effect on the change in the k value as well as in the change in thickness in the low-k dielectric layer 18, which often decreases due to sputtering away of the low-k dielectric layer 18. As lines 501 and 502 show, the change in the thickness and the change in the k value increase with increasing bias power level applied to the substrate 10. In contrast, the gas energizing power level and pressure do not appear to affect the k value and thickness as strongly. Lines 503 and 504 shown the change in thickness and k value, respectively, for increasing gas activation power level. Lines 505 and 506 show the change in thickness and k value, respectively, for increasing pressure. Increasing the bias power level increases the bombardment of the substrate 10 by ionic species. Thus, this data shows that one of the dominant factors in the change in the k value is the bombardment of the substrate 10 by ionic species. Accordingly, an improved cleaning process filters ionic species from the cleaning gas to reduce the bombardment of the substrate 10.

Example 3

In this example, the change in the k value resulting from conventional cleaning processes having different cleaning gas compositions were evaluated. The substrates 10 cleaned in the processes comprised a low-k dielectric layer 18 having a thickness of 1500 Å. In the cleaning processes, the cleaning gases listed in table 2 were energized by coupling energy to the gases in a process zone. In a first cleaning process, the substrate bias power level was 300 Watts and the gas pressure was 0.5 mTorr. In a second cleaning process, the substrate bias power level was 10 Watts and the gas pressure was 80 mTorr. The percent change in the k value of the low-k dielectric layer was measured after each cleaning process. The results for the cleaning processes are shown in table 2 below.

TABLE 2

| Cleaning Process | Gas Composition | $\Delta k$ (%) |
| --- | --- | --- |
| 1 | He | 20 |
|   | Ar | 5-15 |

TABLE 2-continued

| Cleaning Process | Gas Composition | $\Delta k$ (%) |
| --- | --- | --- |
|   | $H_2$ | 19 |
|   | $CH_4$ (10%) He (90%) | 25 |
| 2 | He | 11 |
|   | Ar | 9 |
|   | $H_2$ | 21 |
|   | $H_2$ (5%) He (95%) | 11 |
|   | $CH_4$ (10%) He (90%) | 25 |
|   | $H_2$ (5%) $N_2$ (95%) | 13-30 |
|   | $O_2$ (5%) Ar (95%) | 15 |

Thus, table 2 demonstrates that the conventional cleaning processes with different types of cleaning gases fail to result in good cleaning of the substrate 10 without an accompanying and undesirable increase in the k value. The increase in the k value was as large as 30% for cleaning processes with hydrogen-containing gases. While the percent k value change for the Ar cleaning gas process was the smallest, the Ar gas often does not sufficiently clean metal oxide from the substrate 10 without applying a larger bias power level that results in an unacceptably large increase in the k value.

Example 4

In this example, substrates 10 were cleaned by a relatively gentler cleaning process by providing a large number of hydrogen radical-containing species to clean metal oxide from the substrates 10. The relatively gentler cleaning process involved forming an energized hydrogen-containing gas in a remote zone, and filtering the energized gas by passing the energized gas over a quartz surface 60 to reduce the number of ionic species in the gas and provide a greater number of hydrogen radical-containing species. The substrates 10 cleaned in the process comprised a low-k dielectric layer 18 having a thickness of 1500 Å. The cleaning gas comprised 3000 sccm $H_2$, and the cleaning process was performed for 40 seconds at the gas energizing power levels and temperatures listed in Table 3 below. The change in the k values of the dielectric layers 18 were measured and are listed in Table 3.

TABLE 3

| Process Conditions | $\Delta k$ (%) |
| --- | --- |
| 1400 Watts/175° C. | 2 |
|   | 2 |
|   | 3 |
| 500 Watts/175° C. | 2 |
|   | 1 |
|   | 2 |
| 500 Watts/250° C. | 5 |
|   | 5 |
|   | 5 |

Thus, comparison of Tables 1, 2 and 3 shows that a cleaning process in which the energized cleaning gas comprises a greater number of hydrogen-containing radicals results in a substantially decreased change in the k value, and thus provides improved cleaning over processes which do not filter to reduce the number of ionic species in the gas. The conventional cleaning processes which do not filter the ionic species result in a percent change in the k value that can be as much as 20 and even 30 times greater than the percent change in k value for a cleaning gas process having a reduced number of ionic species. Accordingly, improved cleaning of substrates 10 having low-k dielectric layers can be provided by filtering an energized hydrogen-containing gas to reduce the number of ionic species in the gas, thereby improving the quality of the processed substrates 10 and allowing dielectric layers 18 having smaller thicknesses to be cleaned substantially without damaging the layers.

Example 5

The example demonstrates the importance of temperature in the cleaning of substrates with an energizing gas comprising hydrogen-containing radicals. Substrates 10 comprising low-k dielectric layers having a thickness of 1500 Å were cleaned by energizing a cleaning gas comprising 3000 sccm $H_2$ and 30 sccm $H_2O$ in a remote source 35 by applying a microwave power level of 1400 Watts. The temperature of the substrate 10 was varied for each substrate 10 cleaned, as shown in Table 4 below. The k value was measured before and after cleaning, and the percent change in the k value was determined. The k values were measured to be about 3 after cleaning. It should be noted that, because of noise due to wafer-to-wafer variations and the relatively small number of substrates cleaned, the measured change in k value is larger than the actual change and also larger than those shown in Table 3 above. However, table 4 shows a general trend of the k value increasing with increasing temperature.

TABLE 4

| Substrate Temperature (° C.) | ΔK (%) |
|---|---|
| 85 | 8.9 |
|  | 7.6 |
|  | 7.8 |
| 125 | 13.6 |
|  | 10.7 |
|  | 8.2 |
| 150 | 11.7 |
|  | 13.2 |
|  | 9.8 |
| 200 | 16.0 |
|  | 14.6 |
|  | 13.4 |

Figure 7:
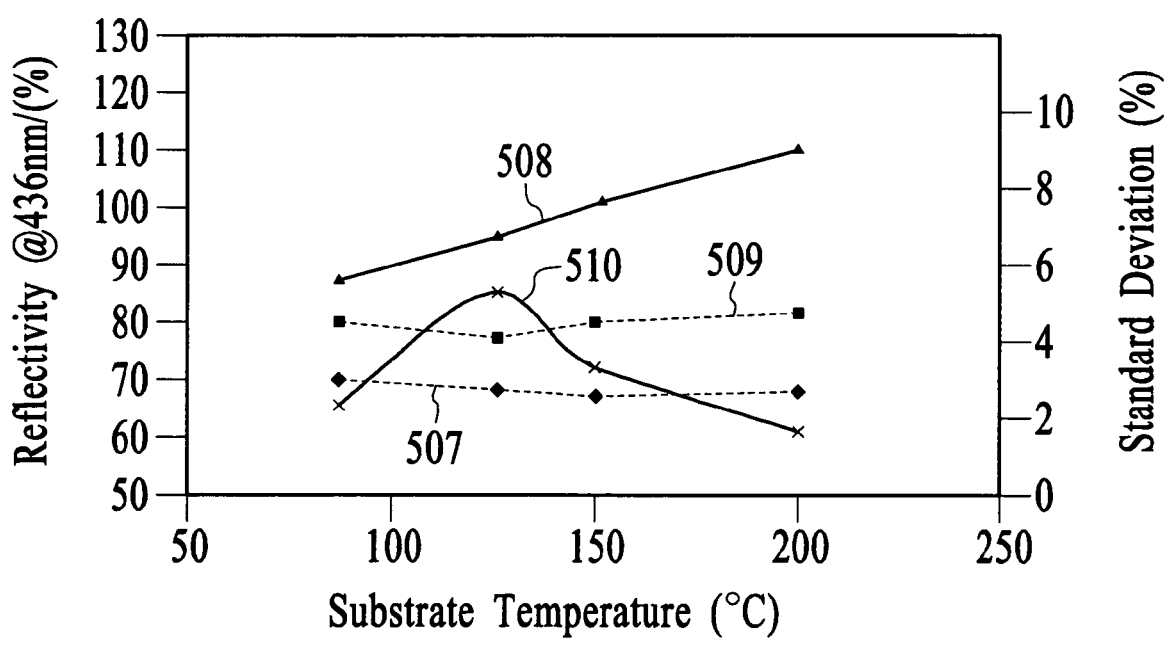
FIG. 7 is a graph of the percent reflectivity and standard deviation of the percent reflectivity for increasing substrate temperature after a substrate cleaning process.

The reflectivity of the cleaned substrates was also measured, and the percent reflectivity is graphed for increasing substrate temperature in FIG. 7. A higher reflectivity indicates that more of the native oxide has been removed from the surface 14 of the copper conductor 16, while a low reflectivity indicates the presence of copper oxide on the surface 14. Line 507 is the average reflectivity before the cleaning process, line 508 is the average reflectivity after the cleaning process, and lines 509 and 510 are the percent standard deviations of the reflectivity measurements before and after the cleaning processes, respectively. Thus, the graph shows that better cleaning of the substrate 10 is obtained at higher temperatures, although good cleaning is still obtained for the lower substrate temperature of 80° C. Accordingly, table 4 and the graph of FIG. 7 show that good cleaning results can be provided by cleaning with hydrogen-containing radicals, and also show that the temperature should be carefully selected to provide optimum cleaning without excessively increasing the k value of the low-k dielectric layer.

Example 6

This example demonstrates the improved results that can be provided by performing a the heat treatment step. In this example, a substrate 10 comprising a copper conductor 16 and low-k dielectric layer 18 was processed in a heat treatment process comprising heating the substrate to a temperature of at least about 100° C. while providing a flow of $H_2$ gas. The heat treated substrate 10 was then cleaned in a cleaning process with a remotely energized gas comprising filtered hydrogen-containing radical species, to remove deposits 12 from the surface 14 of the copper conductor 16. A deposition process was then performed to deposit a second metal-containing conductor 21 comprising a tantalum nitride layer on the cleaned surfaces 14. The electrical resistance of the copper and tantalum nitride interconnect features 20 were measured for features 20 across the substrate 10, as shown by line 600 in FIG. 8.

To compare with the heat treatment results, substrates 10 were also processed without a heat treatment step, and the electrical resistance of features 20 across substrates 10 were measured. In one process, the substrate 10 was cleaned by a remotely energized gas comprising filtered hydrogen-containing radicals before depositing the tantalum nitride layer on the substrate 10, and without a separate heat treating step, the results of which are shown by line 602. In another process, a tantalum nitride layer was deposited on the substrate 10 without performing a prior cleaning or heat-treating step, the results of which are shown by line 604.

Figure 8:
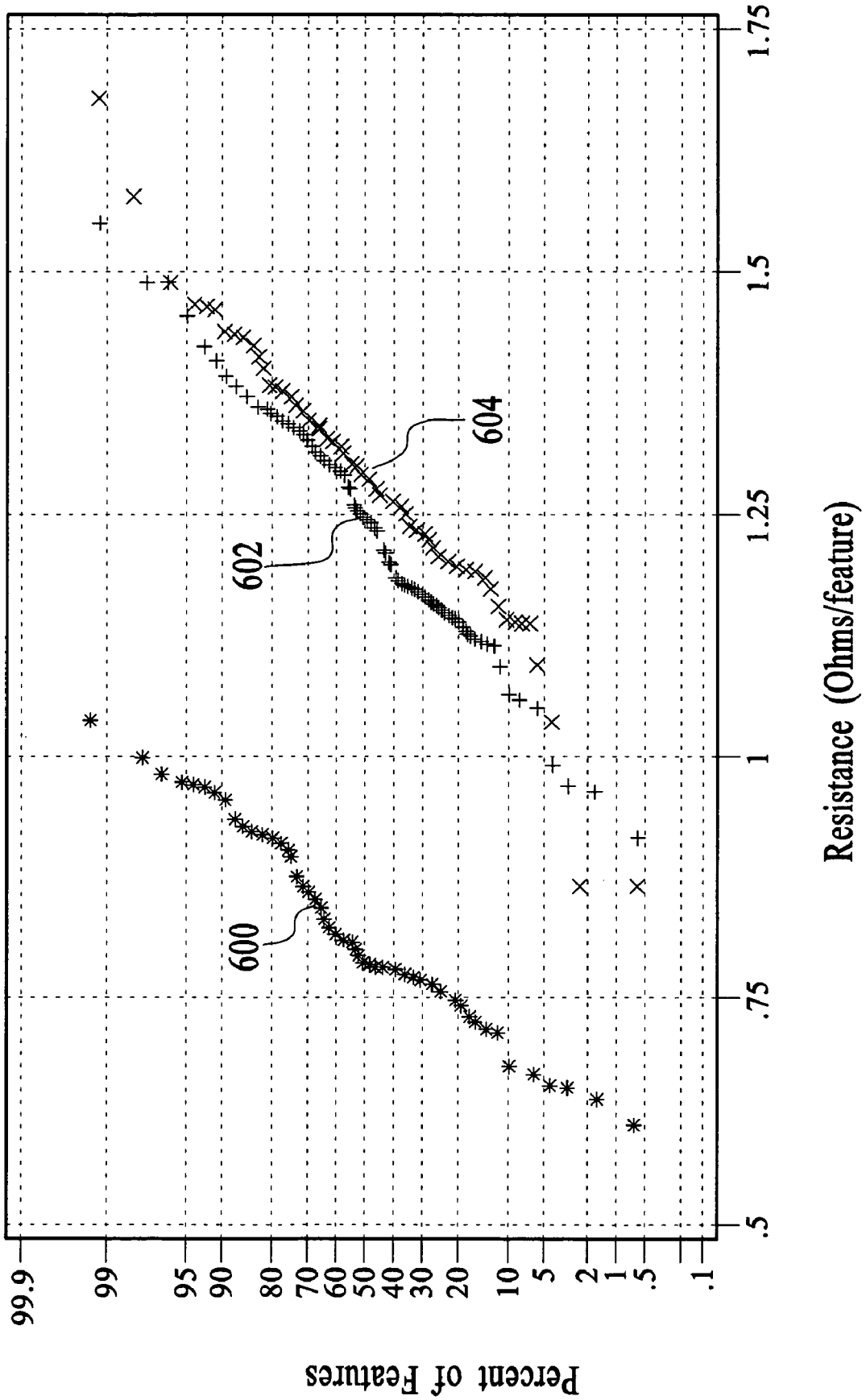
FIG. 8 is a graph of the percent of features on a substrate having a measured contact resistance for increasing contact resistance values.

FIG. 8 shows the percentage of features 20 across the substrate 20 that have a lower contact resistance is much higher for substrates processed with a heat-treatment step prior to cleaning and depositing material on the substrate. FIG. 8 is a graph showing the percentage of features having a resistance at or below a resistance measurement value, with the measured resistance value being shown on the x-axis of the graph, and the percentage of features being shown on the y-axis of the graph. As shown by line 600, the heat-treatment step provides a resistance of less than about 1 Ohm/feature for more than about 95% of the features 20 across the substrate. In contrast, substrates 10 processed without the heat treatment exhibit less than about 5% of the features 20 having a resistance of less than about 1 Ohm/feature.

Example 7

Figure 9:
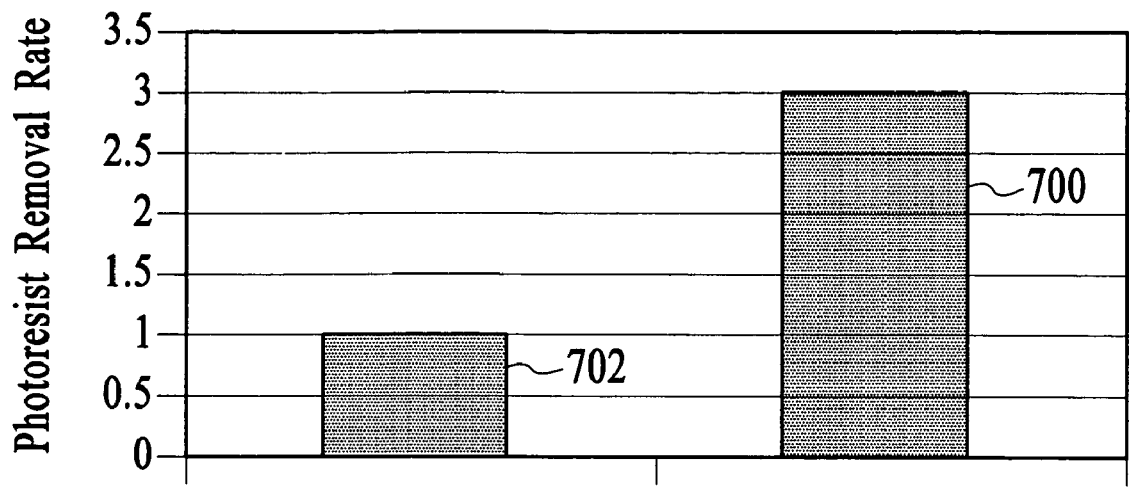
FIG. 9 is a comparative graph showing the photoresist removal rate for cleaning processes.

This example further demonstrates the improved cleaning results provided by the energized cleaning gas comprising filtered hydrogen-containing radicals. To determine the ability of the cleaning gas to clean deposits 12 such as carbon-containing residue, substrates 10 comprising a layer of photoresist were exposed to the energized cleaning gas comprising hydrogen-containing radicals. The photoresist removal rates for these substrates were measured, and were compared to the photoresist removal rates for substrates 10 having a layer photoresist that were exposed to a conventional cleaning gas. FIG. 9 shows the photoresist removal rates for the energized cleaning gas comprising hydrogen-containing radicals, shown as bar 700, and the photoresist removal rate for the conventional cleaning gas, shown as bar 702. As FIG. 9 demonstrates, the photoresist removal rate is about 3 times faster with the energized cleaning gas comprising filtered hydrogen-containing radicals, and thus this cleaning gas provides significantly improved cleaning results over the conventional cleaning gas.

Example 8

This example also demonstrates the improved cleaning results provided by the energized cleaning gas comprising filtered hydrogen-containing radicals. In this example, the reflectivity of a substrate 10 having a metal-containing conductor 16 with a native oxide film 12 thereon was measured, as shown by line 704 in FIG. 10. The substrate 10 was then cleaned by exposing the substrate 10 to the energized cleaning gas comprising hydrogen-containing radicals, and the reflectivity of the cleaned substrate 10 was measured as shown by line 706 in FIG. 10. The reflectivity of the cleaned substrate 10 was close to about 120% across the substrate 10, indicating substantially complete removal of the native oxide 12, as compared to the relatively low reflectivity of around 40% of the uncleaned substrate 10. Accordingly, cleaning with the energized cleaning gas comprising filtered hydrogen-containing radicals provides good cleaning of the surfaces of metal-containing conductors 16 on a substrate 10.

Example 9

Figure 11:
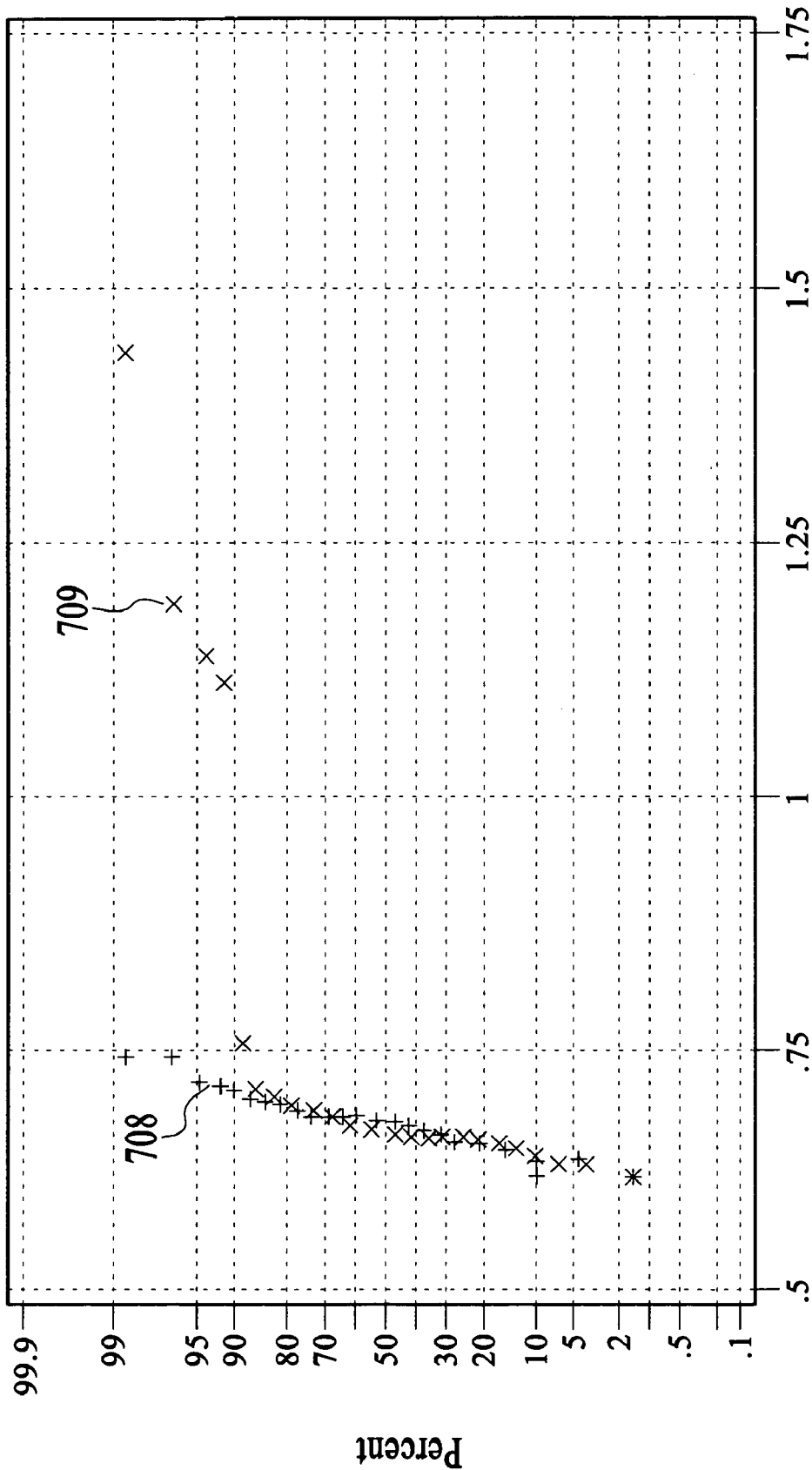
FIG. 11 is a graph of the percent of interconnect structures on a substrate having a measured resistance for increasing resistance values.

In this example, the reduced resistance of features 20 cleaned with an energized cleaning gas comprising filtered hydrogen-containing radicals was demonstrated. To show the improved resistance, a substrate having features 20 with metal-containing conductors 16 was cleaned with the gas comprising hydrogen-containing radicals before depositing a subsequent metal-containing conductors and forming interconnect structures that connected multiple features 20. The resistance of the interconnect structures in Ohms/structure was then tested, and the measured resistance was graphed versus the percent of interconnect structures having the measured resistance, as shown by line 708 in FIG. 11. The resistance of interconnect features formed without a cleaning step was also measured, and is graphed as line 709 in FIG. 11. Thus, the cleaning process with energized cleaning gas comprising filtered hydrogen-containing radicals provided a higher percentage of interconnect structures having a lower resistance over interconnect structures formed without cleaning.

Example 10

Figure 12:
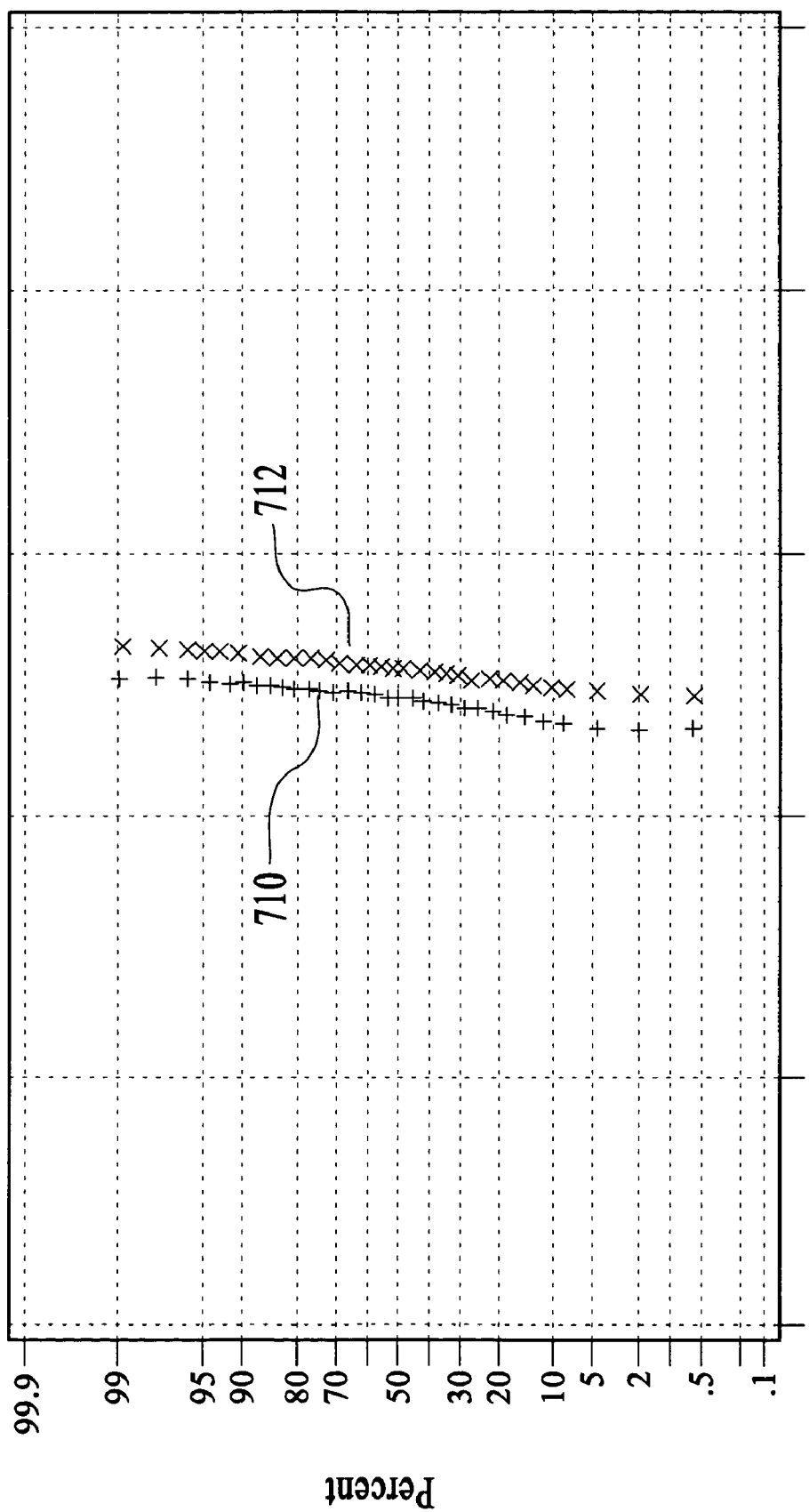
FIG. 12 is a graph of the percent of capacitors on a substrate having a measured capacitance for increasing capacitance values.

In this example, the effect of cleaning with the energized cleaning gas comprising filtered hydrogen-containing radicals on the capacitance was determined. Substrates 10 having a metal-containing conductors 16 were cleaned to remove the deposits before depositing subsequent metal-containing conductors thereover to form interconnect structures. The capacitance of capacitors formed by the processed substrate was then measured, as shown by line 710 in FIG. 12. The cleaning results were compared to the capacitance of capacitors on substrates processed without the cleaning step, as shown by line 712 in FIG. 12. Thus, as FIG. 12 shows, the cleaning process with the energized cleaning gas comprising filtered hydrogen-containing radicals does not substantially change the capacitance of structures on the substrate 10. Accordingly, the effect of the cleaning process on the k-value of the dielectric layer is believed to be desirably minimal.

Although exemplary embodiments of the present invention are shown and described, those of ordinary skill in the art may devise other embodiments which incorporate the present invention, and which are also within the scope of the present invention. For example, the chamber 106a may comprise components other than those specifically described, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A substrate cleaning apparatus comprising:
   (a) a remote source to remotely energize a hydrogen-containing gas to form a remotely energized gas comprising a first ratio of ionic hydrogen-containing species to radical hydrogen-containing species; and
   (b) a process chamber comprising:
      (i) a substrate support;
      (ii) an ion filter capable of filtering the remotely energized gas to form a filtered energized gas having a second ratio of ionic hydrogen-containing species to radical hydrogen-containing species, the second ratio being different than the first ratio; the ion filter comprising a wire grid mounted on or at least partially embedded in a dielectric gas distributor such that the surfaces of the wire grid and the gas distributor are in physical contact and the openings in the wire grid coincide with apertures in the dielectric gas distributor to introduce the filtered energized gas into the chamber.

2. An apparatus according to claim 1 wherein the ion filter filters the remotely energized gas to form a filtered energized gas having a second ratio that is lower than the first ratio.

3. An apparatus according to claim 1 comprising a quartz surface that reduces the number of ionic hydrogen-containing species in the energized gas.

4. An apparatus according to claim 3 wherein a chamber liner comprises the quartz surface.

5. An apparatus according to claim 3 wherein a conduit connecting the remote source and chamber comprises the quartz surface.

6. An apparatus according to claim 1 comprising a detector adapted to detect at least one of a radical and ion concentration at one or more locations in the apparatus.

7. An apparatus according to claim 1 wherein the process chamber is capable of maintaining a sub-atmospheric pressure.

8. An apparatus according to claim 7 wherein the process chamber comprises an exhaust system.

9. An apparatus according to claim 1 wherein the remote source comprises a remote gas energizer to energize the gas in a remote zone that is separated from the process chamber by a distance of from about 1 to about 4 inches.

10. An apparatus according to claim 1 wherein the dielectric gas distributor comprise a gas distribution plate composed of quartz.

11. A substrate cleaning apparatus comprising:
   (a) a remote source comprising a remote gas energizer to energize a hydrogen-containing gas in a remote zone; and
   (b) a process chamber comprising:
      (i) a substrate support;
      (ii) an ion filter capable of filtering the remotely energized hydrogen-containing gas to control a ratio of ionic hydrogen-containing species to radical hydrogen-containing species; the ion filter comprising a wire grid mounted on or at least partially embedded in a gas distribution plate such that the surfaces of the wire grid and the gas distribution plate are in physical contact and the openings in the wire grid coincide with apertures in the gas distribution plate, the gas distribution plate comprising a dielectric material.

12. An apparatus according to claim 11 wherein the remote source remotely energizes the hydrogen-containing gas to form a remotely energized gas comprising a first ratio of ionic hydrogen-containing species to radical hydrogen-containing species, and the ion filter filters the remotely energized gas to form a filtered energized gas having a second ratio of ionic hydrogen-containing species to radical hydrogen-containing species, the second ratio being lower than the first ratio.

13. An apparatus according to claim 11 comprising a quartz surface that reduces the number of ionic hydrogen-containing species in the energized gas passed to the process chamber.

14. An apparatus according to claim 11 comprising a detector adapted to detect at least one of a radical and ion concentration at one or more locations in the apparatus.

15. An apparatus according to claim 11 wherein the remote source is separated from the process chamber by a distance of from about 1 to about 4 inches.

16. An apparatus according to claim 11 wherein the dielectric material of the gas distribution plate comprises quartz.

* * * * *